(12) United States Patent
Katti

(10) Patent No.: US 10,802,087 B2
(45) Date of Patent: *Oct. 13, 2020

(54) SPINTRONIC ACCELEROMETER

(71) Applicant: Honeywell International Inc., Morris Plains, NJ (US)

(72) Inventor: Romney R. Katti, Shorewood, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/221,204

(22) Filed: Dec. 14, 2018

(65) Prior Publication Data
US 2020/0081078 A1 Mar. 12, 2020

Related U.S. Application Data

(60) Provisional application No. 62/729,871, filed on Sep. 11, 2018.

(51) Int. Cl.
G01R 33/09 (2006.01)
G01P 15/08 (2006.01)
G11B 5/39 (2006.01)
G11C 11/16 (2006.01)
H01F 10/32 (2006.01)
(Continued)

(52) U.S. Cl.
CPC ........... *G01R 33/098* (2013.01); *G01P 15/08* (2013.01); *G01R 33/093* (2013.01); *G11B 5/3909* (2013.01); *G11C 11/16* (2013.01); *H01F 10/3254* (2013.01); *H01L 43/08* (2013.01); *B82Y 25/00* (2013.01); *G11B 2005/3996* (2013.01)

(58) Field of Classification Search
CPC ..... G01R 33/098; G01R 33/093; G01P 15/08; G11B 5/3909; G11C 11/16
See application file for complete search history.

(56) References Cited

U.S. PATENT DOCUMENTS 5,764,567 A 6/1998 Parkin
5,962,782 A 10/1999 O'Keefe et al.
6,052,263 A 4/2000 Gill
(Continued)

FOREIGN PATENT DOCUMENTS

CN 102853826 A 1/2013
CN 206132803 U 4/2017
(Continued)

OTHER PUBLICATIONS

Lutz et al., DE 102014206067 (same as EP 2927698). (Year: 2015).*

(Continued)

*Primary Examiner* — Kyung S Lee
(74) *Attorney, Agent, or Firm* — Shumaker & Sieffert, P.A.

(57) ABSTRACT

A magnetic tunnel junction (MTJ) based sensor device includes a MTJ element and processing circuitry. The MTJ element includes a free layer, a pinned layer, and a tunnel barrier, the tunnel barrier being arranged between the free layer and the pinned layer. The free layer is adapted to flex away from the tunnel barrier during acceleration. The processing circuitry is configured to measure a resistance at the MTJ element and determine acceleration based on the resistance at the MTJ element.

20 Claims, 24 Drawing Sheets

(51) Int. Cl.
*H01L 43/08* (2006.01)
*B82Y 25/00* (2011.01)

(56) References Cited

U.S. PATENT DOCUMENTS

| | | | |
|---|---|---|---|
| 6,131,457 | A | 10/2000 | Sato |
| 6,507,187 | B1 | 1/2003 | Olivas et al. |
| 7,145,330 | B2 | 12/2006 | Xiao |
| 7,239,543 | B2 | 7/2007 | Chung et al. |
| 7,547,480 | B2 | 6/2009 | Chung et al. |
| 7,635,974 | B2 | 12/2009 | Guo et al. |
| 7,656,622 | B2 | 2/2010 | Tera et al. |
| 7,690,263 | B2 | 4/2010 | Jen et al. |
| 7,732,881 | B2 | 6/2010 | Wang |
| 7,738,286 | B2 | 6/2010 | Ito et al. |
| 8,068,316 | B2 | 11/2011 | Dieny et al. |
| 8,104,345 | B2 | 1/2012 | Bruckl et al. |
| 8,120,127 | B2 | 2/2012 | Nagahara et al. |
| 8,698,260 | B2 | 4/2014 | Jan et al. |
| 8,830,737 | B2 | 9/2014 | Keshtbod et al. |
| 8,836,056 | B2 | 9/2014 | Oguz et al. |
| 9,250,070 | B2 | 2/2016 | Wootten |
| 9,254,992 | B2 | 2/2016 | Ju |
| 9,489,998 | B1 | 11/2016 | Schafer |
| 10,008,248 | B2 | 6/2018 | Buhrman et al. |
| 10,082,431 | B2 | 9/2018 | Katti |
| 2003/0179511 | A1* | 9/2003 | Xiao .................. B82Y 25/00 360/324.2 |
| 2007/0097732 | A1* | 5/2007 | Chung ............... G11C 11/1659 365/158 |
| 2007/0180911 | A1 | 8/2007 | Shoji |
| 2008/0164548 | A1* | 7/2008 | Ranjan ................. H01L 43/08 257/421 |
| 2016/0093320 | A1* | 3/2016 | Aria ..................... G11B 5/455 369/53.38 |
| 2016/0153780 | A1 | 6/2016 | Zhang et al. |
| 2017/0092846 | A1 | 3/2017 | Doyle et al. |
| 2017/0160308 | A1 | 6/2017 | Alaoui |
| 2017/0170237 | A1* | 6/2017 | Jung .................. H01L 45/1233 |
| 2017/0178705 | A1* | 6/2017 | Buhrman .............. H01L 43/08 |
| 2017/0249550 | A1 | 8/2017 | Sengupta et al. |
| 2018/0033954 | A1* | 2/2018 | Aradhya ............... H01L 43/06 |
| 2018/0190899 | A1 | 7/2018 | Kim et al. |

FOREIGN PATENT DOCUMENTS

| | | |
|---|---|---|
| CN | 106645797 A | 5/2017 |
| CN | 104567848 B | 9/2017 |
| CN | 107255737 A | 10/2017 |
| CN | 107421525 A | 12/2017 |
| DE | 102014206067 | 10/2015 |
| JP | 2009122041 | 6/2009 |
| WO | 2018125142 A | 7/2018 |

OTHER PUBLICATIONS

Lirkov et al., "Large-Scale Scientific Computing," 10th International Conference, LSSC 2015, Jun. 8, 2015, 442 pp.
Elwell, "The development of magnetic tunnel junction fabrication techniques," Jul. 31, 200, 230 pp.
U.S. Appl. No. 62/193,742, by Romney R. Katti, et al., filed Jul. 17, 2015.
Response to Extended Search Report dated Jan. 24, 2020, from counterpart European Application No. 19195760.4, filed Apr. 6, 2020, 17 pp.
Extended Search Report from counterpart European Application No. 19195760.4, dated Jan. 24, 2020, 8 pp.

* cited by examiner

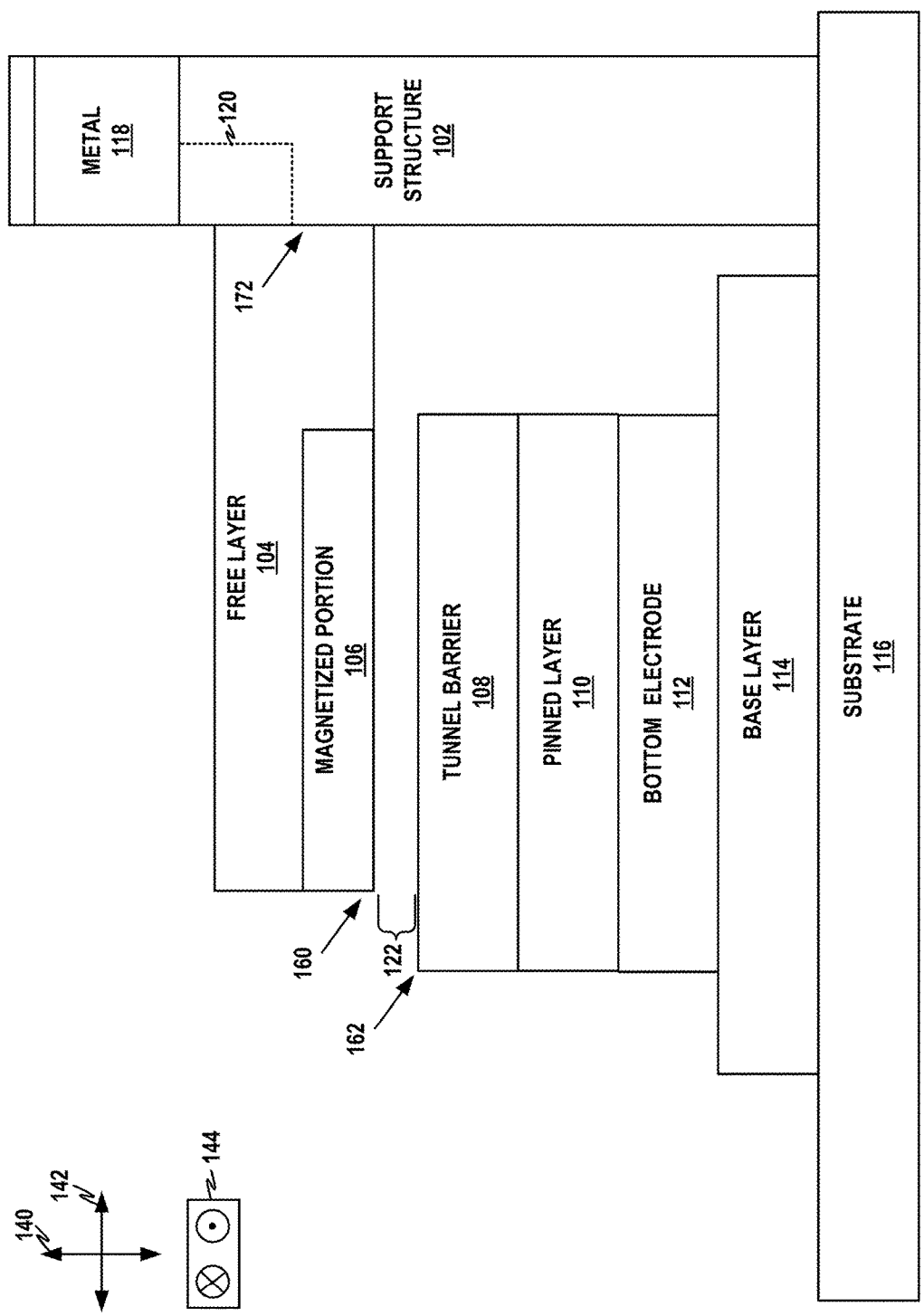

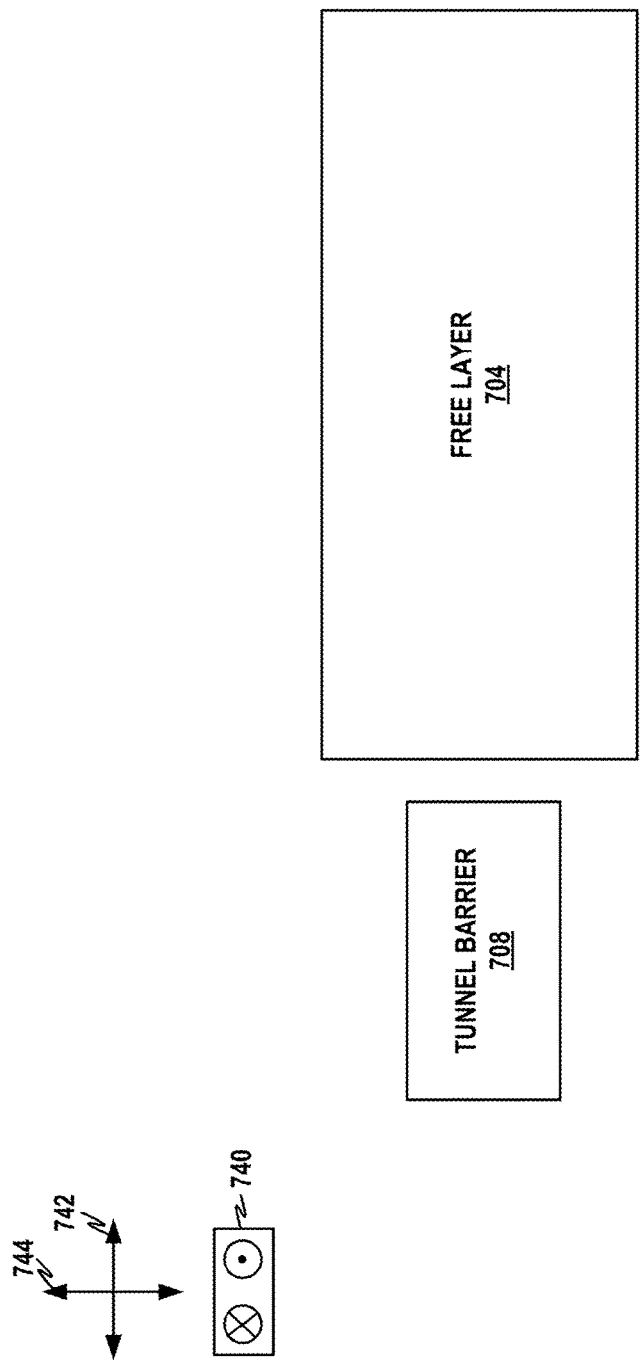

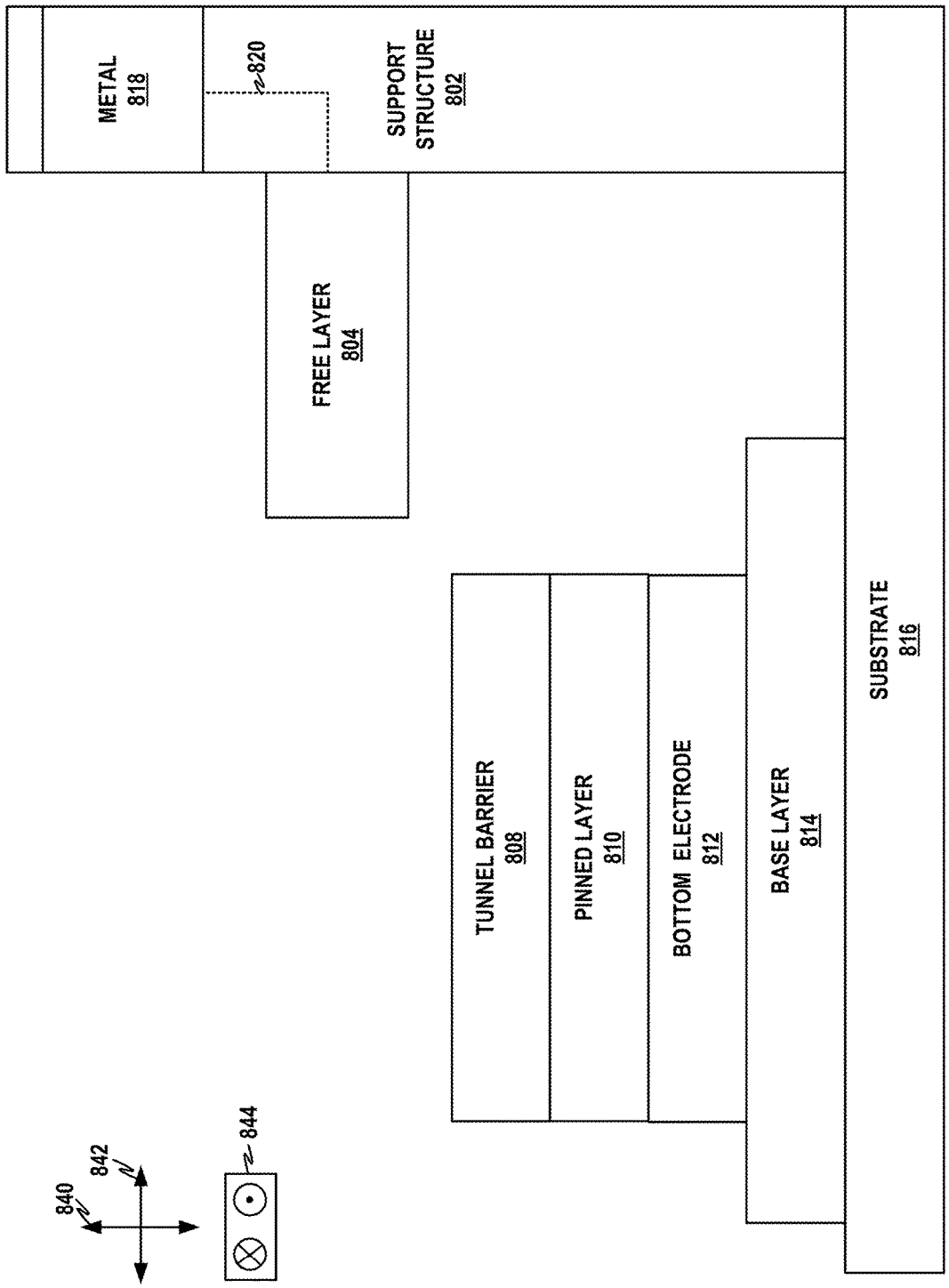

US 10,802,087 B2

SPINTRONIC ACCELEROMETER

PRIORITY CLAIM

This application claims the benefit of U.S. Provisional Patent Application No. 62/729,871, filed Sep. 11, 2018, the entire content of which is incorporated herein by reference.

TECHNICAL FIELD

This disclosure relates to sensor devices and, more specifically, to spintronic-based devices that are configured to detect acceleration.

BACKGROUND

Some devices include an accelerometer that monitors acceleration of a device. It is desirable for such devices to detect acceleration of the device to provide context of the device. For example, a position of the device may be controlled based on the acceleration of the device. It is generally desirable for an accelerometer to accurately measure acceleration and to operate in a smaller space. Current types of accelerometers include piezoelectric displacement transducers that generate a voltage when deformed by an acceleration.

SUMMARY

This disclosure generally describes techniques for detecting acceleration using a spintronic-based sensor device. The techniques may in some instances provide for a higher density for a smaller and more lightweight form factor. Furthermore, a spintronic-based sensor device may be more resistive to ElectroMagnetic Interference (EMI) than a piezoelectric displacement transducer, which may be of particular benefit to certain applications.

In one example, a magnetic tunnel junction (MTJ) based sensor device includes a MTJ element and processing circuitry. The MTJ element includes a free layer, a pinned layer, and a tunnel barrier, the tunnel barrier being arranged between the free layer and the pinned layer, wherein the free layer is adapted to flex away from the tunnel barrier during acceleration. The processing circuitry is configured to measure a resistance at the MTJ element and determine acceleration based on the resistance at the MTJ element.

In another example, a method for detecting acceleration using a magnetic tunnel junction (MTJ) based sensor device includes measuring, by processing circuitry, a resistance at the MTJ element, wherein the MTJ element comprises a free layer, a pinned layer, and a tunnel barrier, the tunnel barrier being arranged between the free layer and the pinned layer. The free layer is adapted to flex away from the tunnel barrier during acceleration. The method further includes determining, by the processing circuitry, acceleration based on the resistance at the MTJ element.

In another example, a MTJ based sensor device includes means for measuring a resistance at the MTJ element. The MTJ element comprises a free layer, a pinned layer, and a tunnel barrier, the tunnel barrier being arranged between the free layer and the pinned layer. The free layer is adapted to flex away from the tunnel barrier during acceleration. The device further includes means for determining acceleration based on the resistance at the MTJ element.

The details of one or more aspects of the disclosure are set forth in the accompanying drawings and the description below. Other features, objects, and advantages of the devices, systems, methods, and techniques described in this disclosure will be apparent from the description and drawings, and from the claims.

BRIEF DESCRIPTION OF DRAWINGS

FIG. 1A shows a conceptual illustration of a cross-sectional view of a first magnetic tunnel junction (MTJ) element configured to detect acceleration.

FIG. 7B shows a conceptual illustration of a top-view of the seventh MTJ element of FIG. 7A.

FIG. 8A shows a conceptual illustration of a cross-sectional view of an eighth MTJ element configured to detect acceleration.

DETAILED DESCRIPTION

Figure 1B:
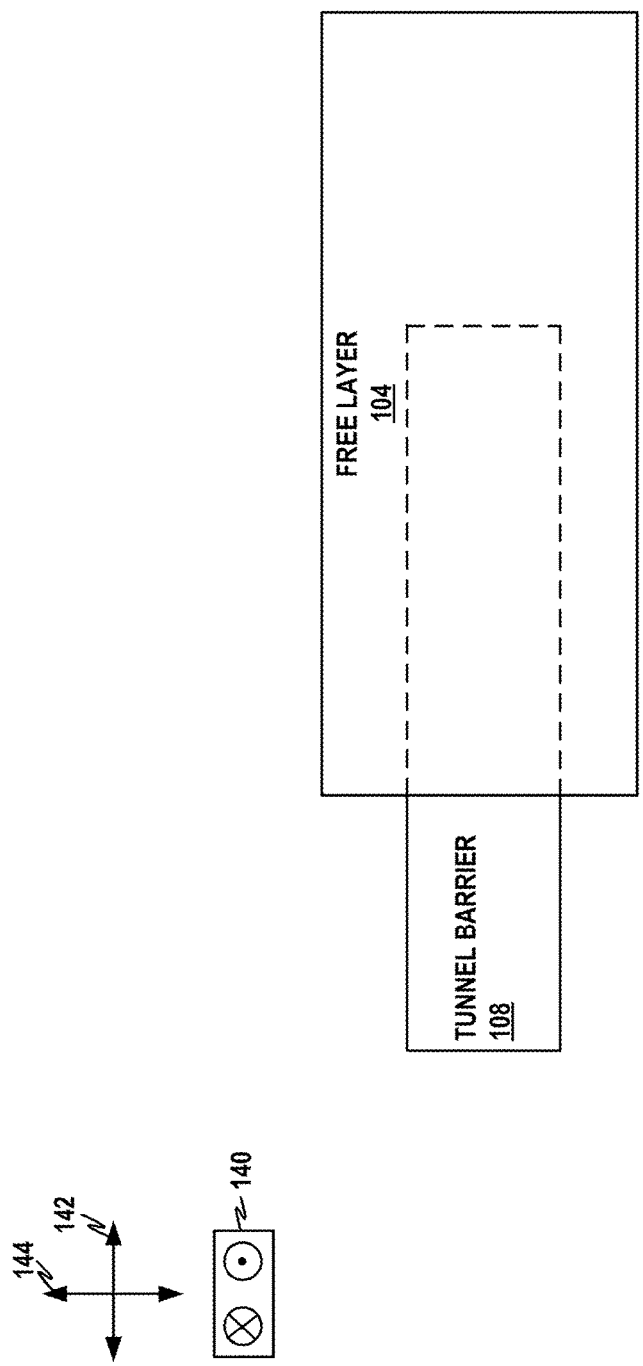
FIG. 1B shows a conceptual illustration of a top-view of the first MTJ element of FIG. 1A.

Some applications have been identified in which miniaturized sensing devices are needed for operation in unique environments. Such sensing devices may be configurable for strategic applications. For example, such sensing devices may be radiation-hardened, and include magnetically-based devices that can be integrated (e.g., monolithically, in particular initially) into a compact module with Application-Specific Integrated Circuits (ASICs) including those that contain embedded Magnetoresistive Random Access Memory (MRAM) bits. Of various sensing devices of interest, one device of interest that is discussed here is an acceleration sensor device that could be used with or separately from other sensors (e.g., a gyroscope, a mechanical shock and vibration sensor, etc.), and that may support compatibility with MRAM technology.

In accordance with one or more techniques described herein, circuitry may be constructed to include a magnetic tunnel junction (MTJ), which is an example of a spintronic device, with desired, resistance, resistance-area product, and dimensions. Examples of resistance and/or magnetoresistance may include, but are not limited to, tunnel magnetoresistance (TMR), giant magnetoresistance (GMR), anisotropic magnetoresistive (AMR), and other resistance and/or magnetoresistance effects.

Within a tunnel barrier structure between two magnetic layers of the MTJ, techniques described herein may include one or more test masses (e.g., one or more free layers), which are ferromagnetic or contain ferromagnetic components, that can be placed in a MEMS (micro-electro-mechanical systems) structure or suspended or cantilevered to respond to acceleration. Processing circuitry may make use electrical, electronic, or spintronic current(s). Tunneling current(s) can be spin-dependent or spin-independent, and ballistic electron tunneling may be used. Anisotropic, Giant, and/or Tunneling Magneto-Resistive effects may be used for sensing acceleration.

For example, a free layer may flex towards and/or away from a tunnel barrier. Such flexing by the free layer may cause a corresponding change in resistance of the MTJ. In this way, processing circuitry may detect acceleration using the resistance of the MTJ. As used in this disclosure, the term acceleration may refer to both positive acceleration and negative acceleration. Negative acceleration is also sometimes referred to as deceleration. Depending on the implementation of the sensor device, a free layer may flex towards a tunnel barrier in the presence of one of positive acceleration or negative acceleration and flex away from the tunnel barrier in the presence of the other positive acceleration or negative acceleration.

Such magnetic/spintronic devices may provide unique and desired application functionality, customization prospects, and environmental capability (e.g., shock, vibration, radiation, acceleration, motion) for various environments. Such magnetic/spintronic devices may offer materials and technological similarity and compatibility with MRAM bits and other sensing devices such as accelerometers, gyros, and pressure sensors, which may support integration, modularity, miniaturization, and packaging with embedded MRAM and ASICS. In some examples, the spintronic-based accelerometer described herein may be used for die-to-die or monolithic integration with MTJs/MTJ die.

FIG. 1A shows a conceptual illustration of a cross-sectional view of a first MTJ element 100 configured to detect acceleration. MTJ element 100 may include support structure 102, free layer 104, tunnel barrier 108, pinned layer 110, bottom electrode 112, base layer 114, and substrate 116. As shown in FIG. 1A, support structure 102 extends from substrate 116 along vertical direction 140 and is spaced apart from tunnel barrier 108 along first horizontal direction 142. Second horizontal direction 144 is perpendicular to first horizontal direction 142 and vertical direction 140.

Base layer 114 may comprise, for example, silicon (Si). Substrate 116 may comprise, for example, silicon (Si). In some examples, substrate 116 may include processing circuitry. For example, substrate 116 may include metallization and/or integrated circuitry (e.g., Complementary metal-oxide-semiconductor (CMOS)).

Support structure 102 may be formed of silicon, silicon nitride, silicon oxide, copper, aluminum, aluminum oxide, magnesium oxide, or other material(s). As shown, support structure 102 may include via 120 and metal 118. Via 120 and metal 118 may be formed of a conductive material to permit a connection to MTJ element 100. Examples of conductive materials may include, but are not limited to, copper. Bottom electrode 112 may be formed of a conductive material to permit a connection to MTJ element 100.

Free layer 104 may include a magnetization direction that is free to switch between a parallel orientation and an antiparallel orientation. As shown, free layer 104 may include magnetized portion 106. Magnetized portion 106 may include, for example, but not limited to, a metal and/or a metal/ferromagnetic metal system. For instance, magnetized portion 106 may be formed of a metal or metal/ferromagnetic metal system on Silicon Oxide (SiOx), Silicon Nitride (SiNx), and/or Silicon (Si). In the example of FIG. 1A, first edge 160 (also referred to herein as simply "edge") of free layer 104 is spaced apart from edge 162 of tunnel barrier 108 such that edge 162 extends further from support structure 102 along first horizontal direction 142 than first edge 160. As shown, free layer 104 may extend over tunnel barrier 108.

Free layer 104 may be adapted such that first edge 160 freely moves. For example, first edge 160 may be adapted to freely move along vertical direction 140 while free layer 104 flexes away from tunnel barrier 108. For instance, first edge 160 may be separated and/or unattached from other components of MTJ element 100. As used herein, adapting an edge of free layer 104 to freely move may refer to instances where the edge moves without limitation except from flexing of the free layer 104. Similarly, first edge 160 may be adapted to freely move along vertical direction 140 while free layer 104 flexes towards tunnel barrier 108.

Free layer 104 may be adapted such that second edge 172 is rigidly attached to support structure 102. As shown, second edge 172 is on an opposite side of free layer 104 from first edge 160. In the example of FIG. 1A, support structure 102 is rigidly attached to second edge 172 of free layer 104. Support structure 102 may be spaced apart from pinned layer 110 along first horizontal direction 142. In some examples, support structure 102 may extend at least between free layer 104 and pinned layer 110 along vertical direction 140. As used herein, an edge of free layer 104 that is rigidly attached to support structure 102 may refer to instances where the edge remains adjacent and/or attached to support structure 102 while free layer 104 flexes (from an acceleration).

Tunnel barrier 108 includes a non-magnetic metal that separates free layer 104 and pinned layer 110. In some examples, tunnel barrier 108 may be formed of aluminum oxide, magnesium oxide, or another material. In the example of FIG. 1A, free layer 104 is spaced apart from tunnel barrier 108 along vertical direction 140 by distance 122 during constant velocity (e.g., no acceleration). For instance, a void may separate free layer 104 and tunnel barrier 108. As shown, tunnel barrier 108 may be arranged between free layer 104 and pinned layer 110.

Pinned layer 110 may include a magnetization direction that is fixed or "pinned" to a single orientation. For example, pinned layer 110 may be pinned in a parallel orientation. In other examples, pinned layer 110 may be pinned in an antiparallel orientation. In the example of FIG. 1A, pinned layer 110 may include an anti-ferromagnetic layer, such that the magnetization direction of the pinned layer 110 is "pinned" in a particular orientation the magnetization direction of the pinned layer 110 remains relatively fixed when operational magnetic fields are applied to MTJ element 100.

In the example of FIG. 1A, MTJ element 100 may be formed as follows. Initially, material for tunnel barrier 108 and pinned layer 110 is deposited. An oxide is formed on tunnel barrier 108 and tunnel barrier 108 and pinned layer 110 are etched. Tunnel barrier 108 and pinned layer 110 are encapsulated (for spacing). Material for free layer 104 (which can be rectangular or triangular, e.g., in area) and support structure 102 are deposed. The encapsulating material is removed and/or dissolved.

In the example of FIG. 1A, a magnetization direction of free layer 104 is used to detect an acceleration of MTJ element 100. For example, processing circuitry may detect a magnitude of acceleration using a resistance and/or magnetoresistance of the MTJ element 100. In this manner, MTJ element 100 may be used as an accelerometer.

FIG. 1B shows a conceptual illustration of a top-view of first MTJ element 100 of FIG. 1A. In the example of FIG. 1B, free layer 104 has a rectangular shape along first horizontal direction 142 and second horizontal direction 144.

Figure 1C:
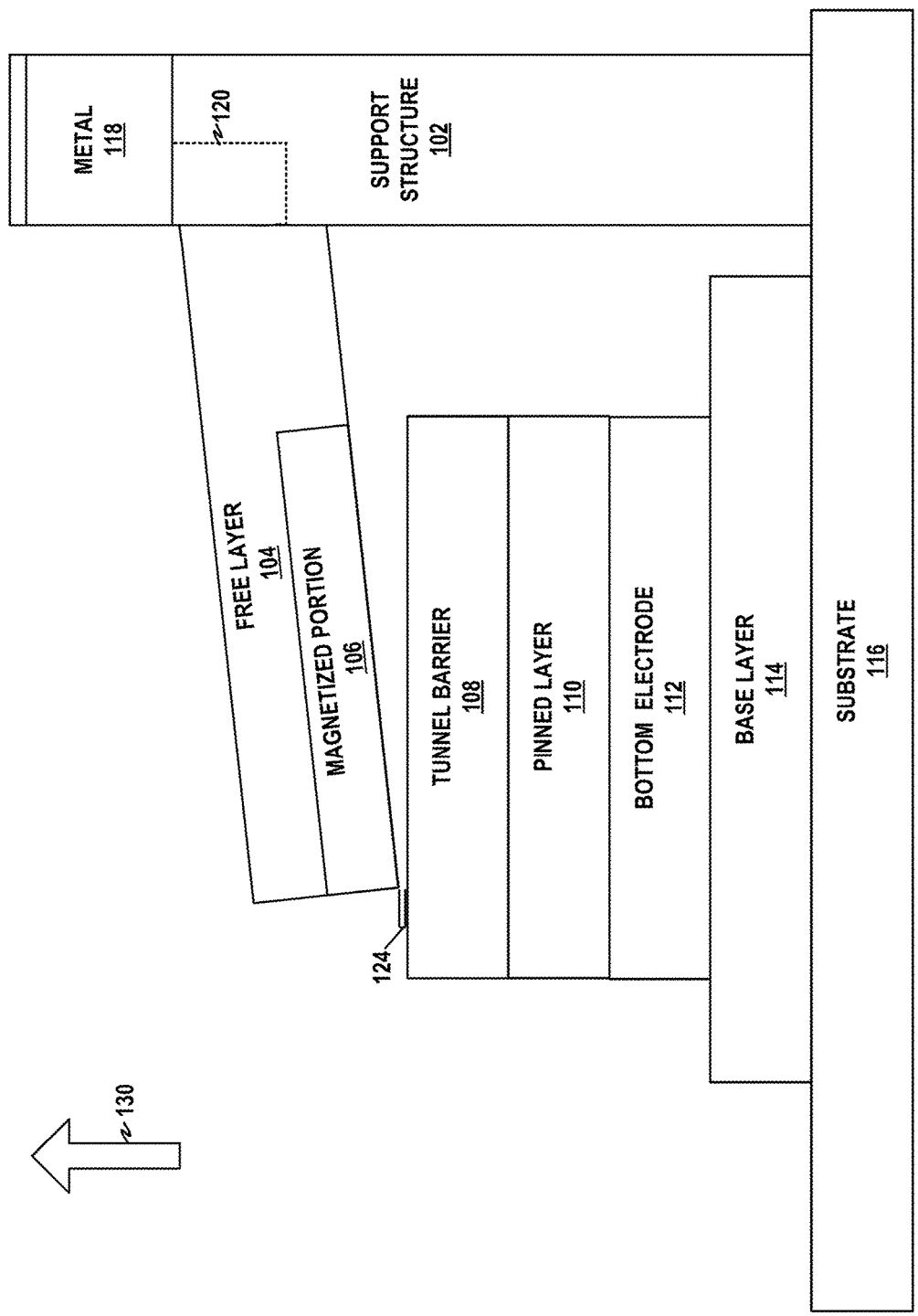
FIG. 1C shows a conceptual illustration of a cross-sectional view of the first MTJ element of FIG. 1A during an acceleration in a first direction.

FIG. 1C shows a conceptual illustration of a cross-sectional view of first MTJ element 100 of FIG. 1A during an acceleration in first direction 130. Free layer 104 may be adapted to flex toward tunnel barrier 108 during acceleration. As shown, the acceleration in first direction 130 causes a flexing in free layer 104 such that free layer 104 is spaced apart from tunnel barrier 108 by distance 124 during acceleration, which is less than distance 122 during constant velocity (e.g., no acceleration). As such, processing circuitry may detect a decrease in a resistance and/or magnetoresistance of MTJ element 100.

Figure 1D:
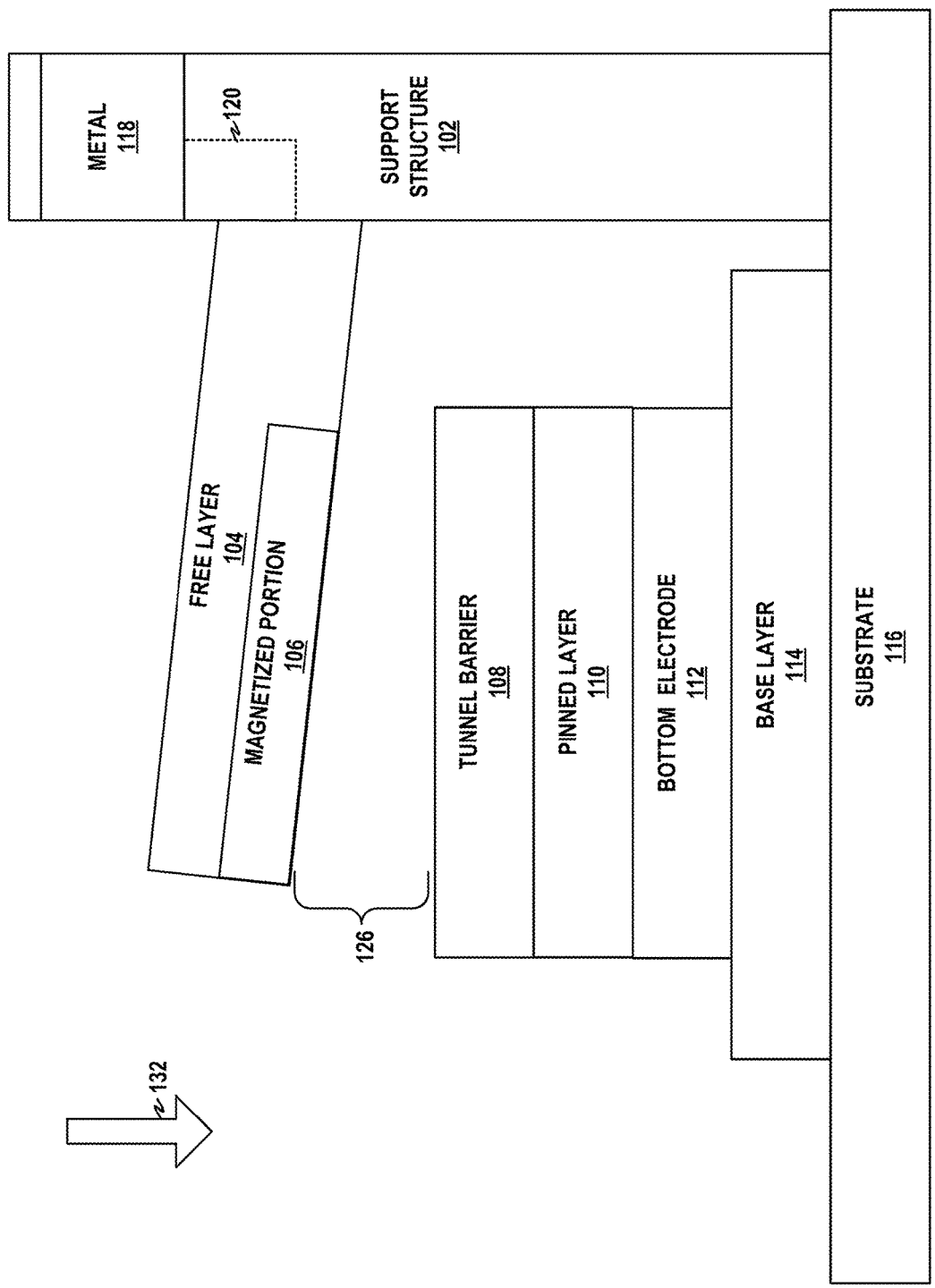
FIG. 1D shows a conceptual illustration of a cross-sectional view of the first MTJ element of FIG. 1A during an acceleration in a second direction.

FIG. 1D shows a conceptual illustration of a cross-sectional view of first MTJ element 100 of FIG. 1A during an acceleration in second direction 132. Free layer 104 may be adapted to flex away from tunnel barrier 108 during acceleration. As shown, the acceleration in second direction 132 causes a flexing in free layer 104 such that free layer 104 is spaced apart from tunnel barrier 108 by distance 126 during acceleration, which is greater than distance 122 during constant velocity (e.g., no acceleration). As such, processing circuitry may detect an increase in a resistance and/or magnetoresistance of MTJ element 100.

Figure 2A:
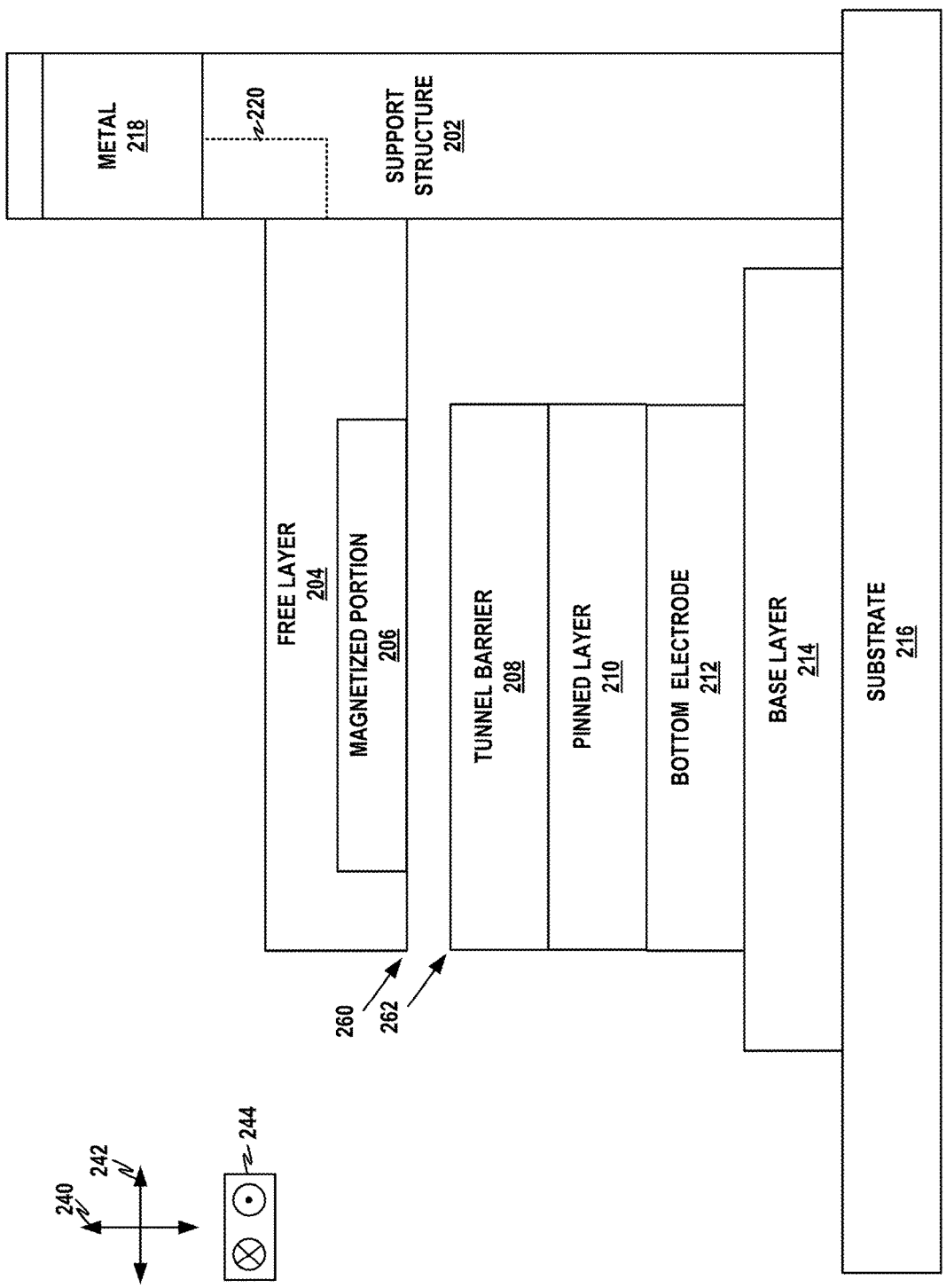
FIG. 2A shows a conceptual illustration of a cross-sectional view of a second MTJ element configured to detect acceleration.

FIG. 2A shows a conceptual illustration of a cross-sectional view of a second MTJ element 200 configured to detect acceleration. MTJ element 200 may include support structure 202, free layer 204, magnetized portion 206, tunnel barrier 208, pinned layer 210, bottom electrode 212, base layer 214, substrate 216, metal 218, and via 220, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. In the example of FIG. 2A, edge 260 extends a distance from support structure 202 along first horizontal direction 242 that corresponds to (e.g., matches) a distance that edge 262 extends from support structure 202 along first horizontal direction 242.

Figure 2B:
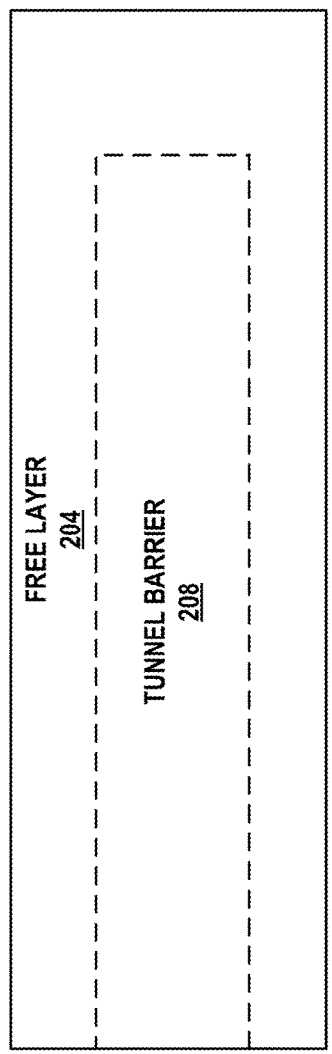
FIG. 2B shows a conceptual illustration of a top-view of the second MTJ element of FIG. 2A.
Figure 2B:
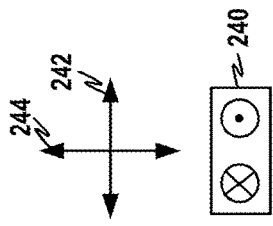

FIG. 2B shows a conceptual illustration of a top-view of second MTJ element 200 of FIG. 2A. In the example of FIG. 1B, free layer 204 has a rectangular shape along first horizontal direction 242 and second horizontal direction 244.

Figure 3A:
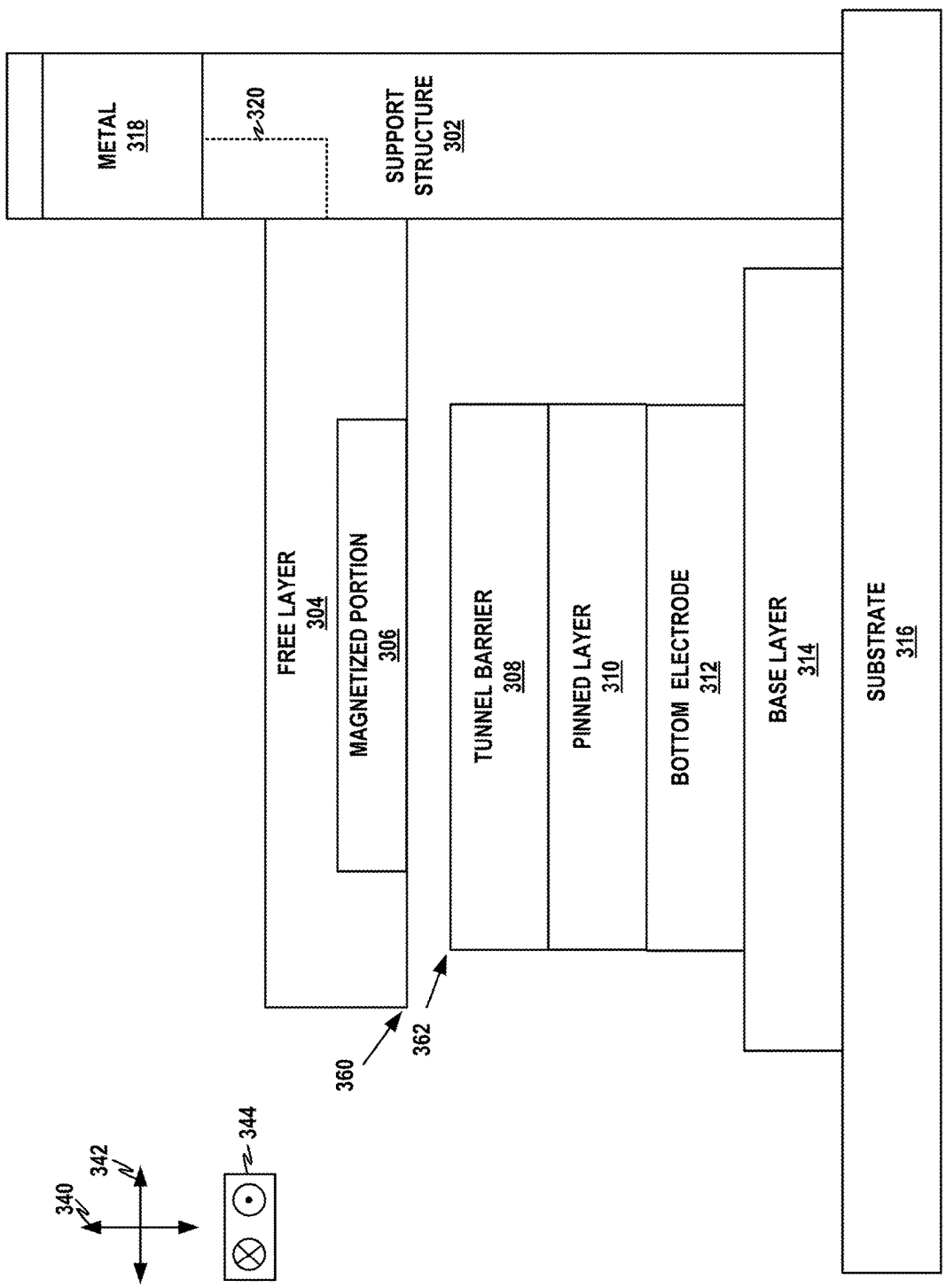
FIG. 3A shows a conceptual illustration of a cross-sectional view of a third MTJ element configured to detect acceleration.

FIG. 3A shows a conceptual illustration of a cross-sectional view of a third MTJ element 300 configured to detect acceleration. MTJ element 300 may include support structure 302, free layer 304, magnetized portion 306, tunnel barrier 308, pinned layer 310, bottom electrode 312, base layer 314, substrate 316, metal 318, and via 320, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. In the example of FIG. 3A, edge 360 of free layer 304 is spaced apart from edge 362 of tunnel barrier 308 such that edge 360 extends further from support structure 302 along first horizontal direction 342 than edge 362.

Figure 3B:
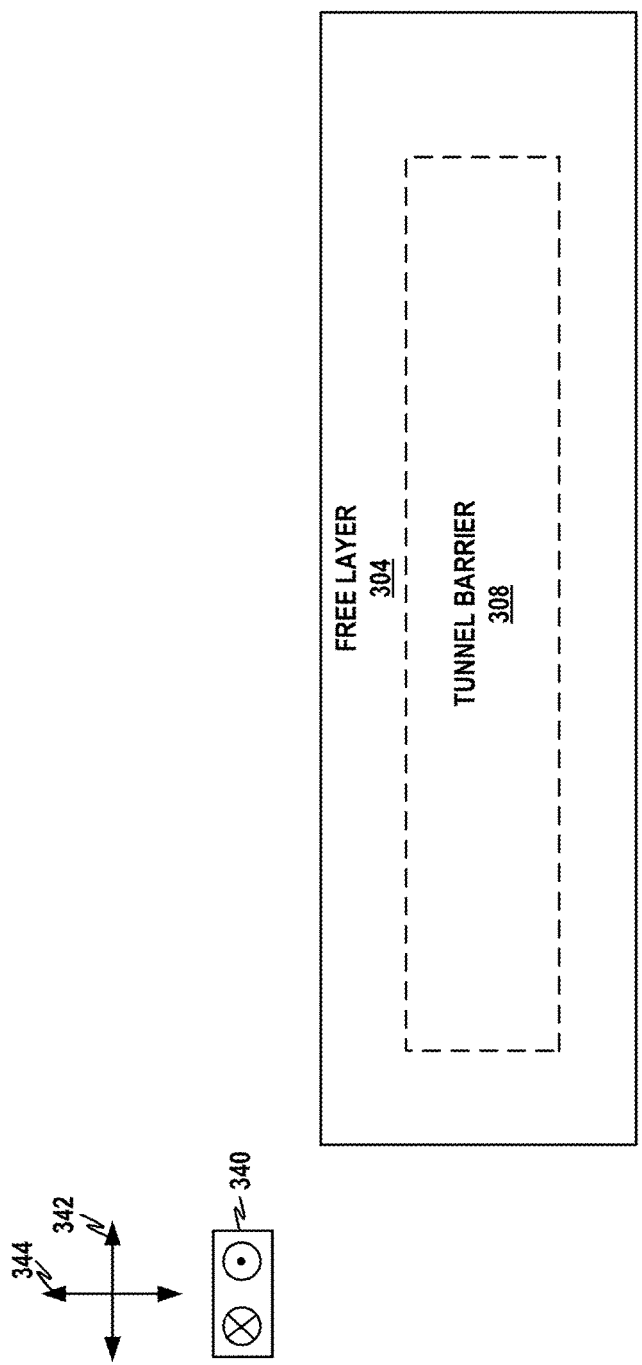
FIG. 3B shows a conceptual illustration of a top-view of the third MTJ element of FIG. 3A.

FIG. 3B shows a conceptual illustration of a top-view of the third MTJ element 300 of FIG. 3A. In the example of FIG. 3B, free layer 304 has a rectangular shape along first horizontal direction 342 and second horizontal direction 344.

Figure 4A:
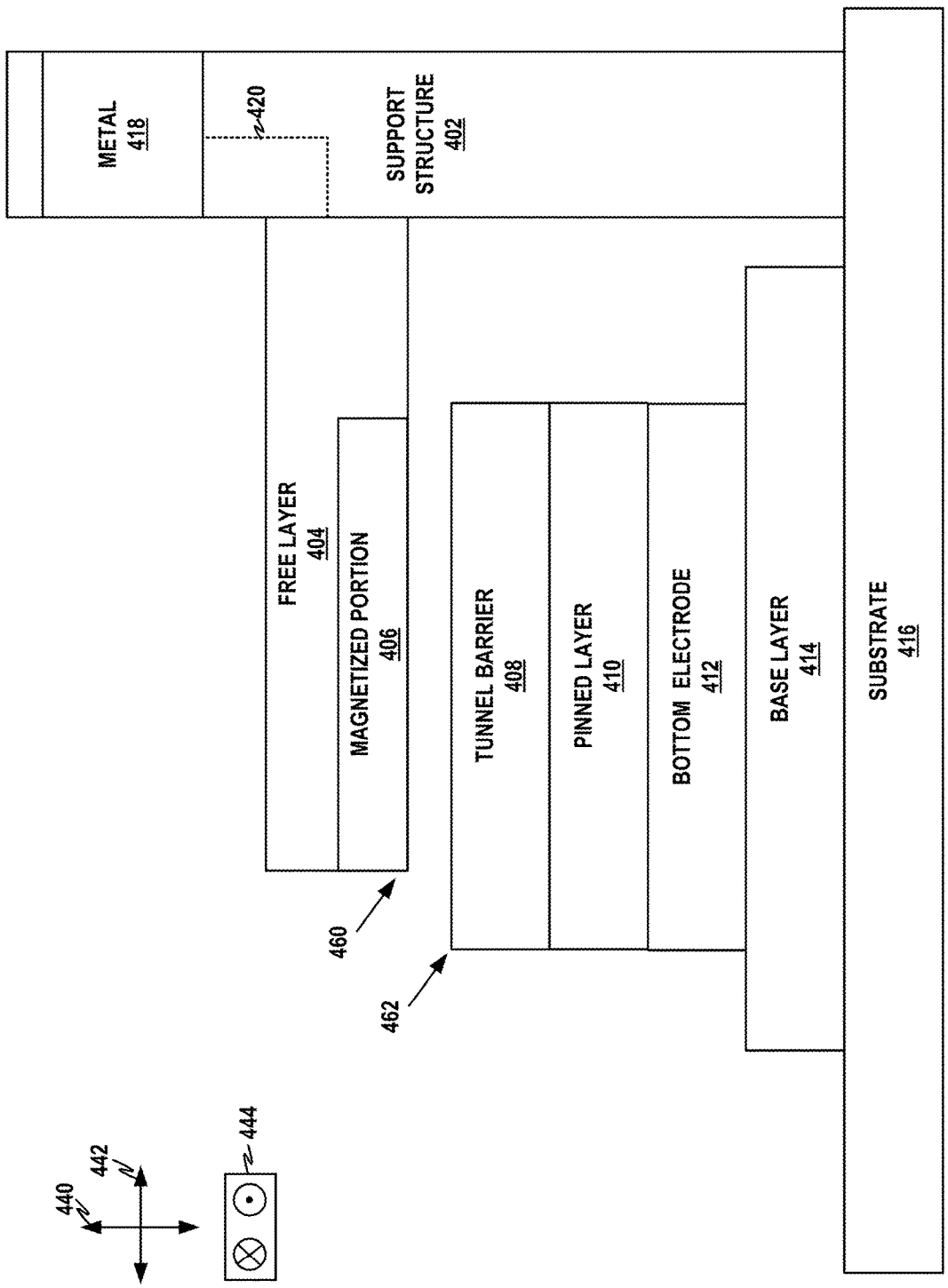
FIG. 4A shows a conceptual illustration of a cross-sectional view of a fourth MTJ element configured to detect acceleration.

FIG. 4A shows a conceptual illustration of a cross-sectional view of a fourth MTJ element configured to detect acceleration. MTJ element 400 may include support structure 402, free layer 404, magnetized portion 406, tunnel barrier 408, pinned layer 410, bottom electrode 412, base layer 414, substrate 416, metal 418, and via 420, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. As shown, edge 460 of free layer 404 may be spaced apart from edge 462 of tunnel barrier 408 such that edge 462 extends further from support structure 402 along first horizontal direction 442 than edge 460. However, in other examples of FIGS. 4A and 4B, edge 460 of free layer 404 may be spaced apart from edge 462 of tunnel barrier 408 such that edge 462 extends further from support structure 402 along first horizontal direction 442 than edge 460 or edge 460 may extend a distance from support structure 402 along first horizontal direction 442 that corresponds to (e.g., matches) a distance that edge 462 extends from support structure 402 along first horizontal direction 442.

Figure 4B:
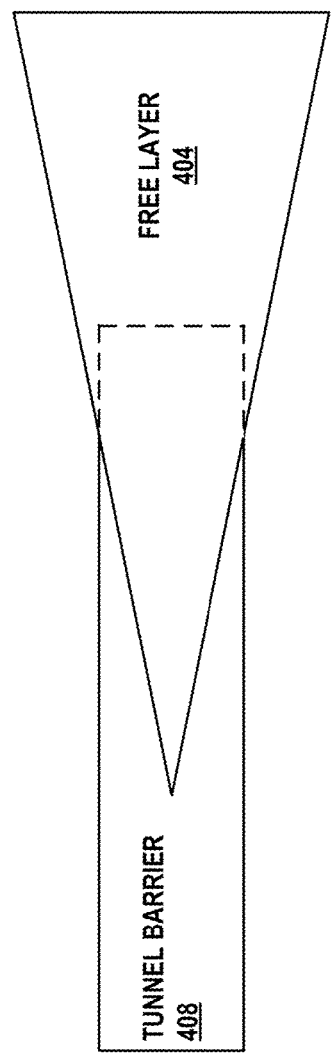
FIG. 4B shows a conceptual illustration of a top-view of the fourth MTJ element of FIG. 4A.
Figure 4B:
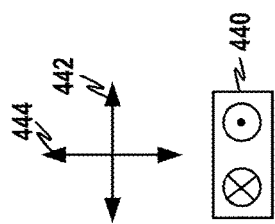

FIG. 4B shows a conceptual illustration of a top-view of the fourth MTJ element 400 of FIG. 4A. In the example of FIG. 4B, free layer 404 has a triangular shape along first horizontal direction 442 and second horizontal direction 444.

Figure 5A:
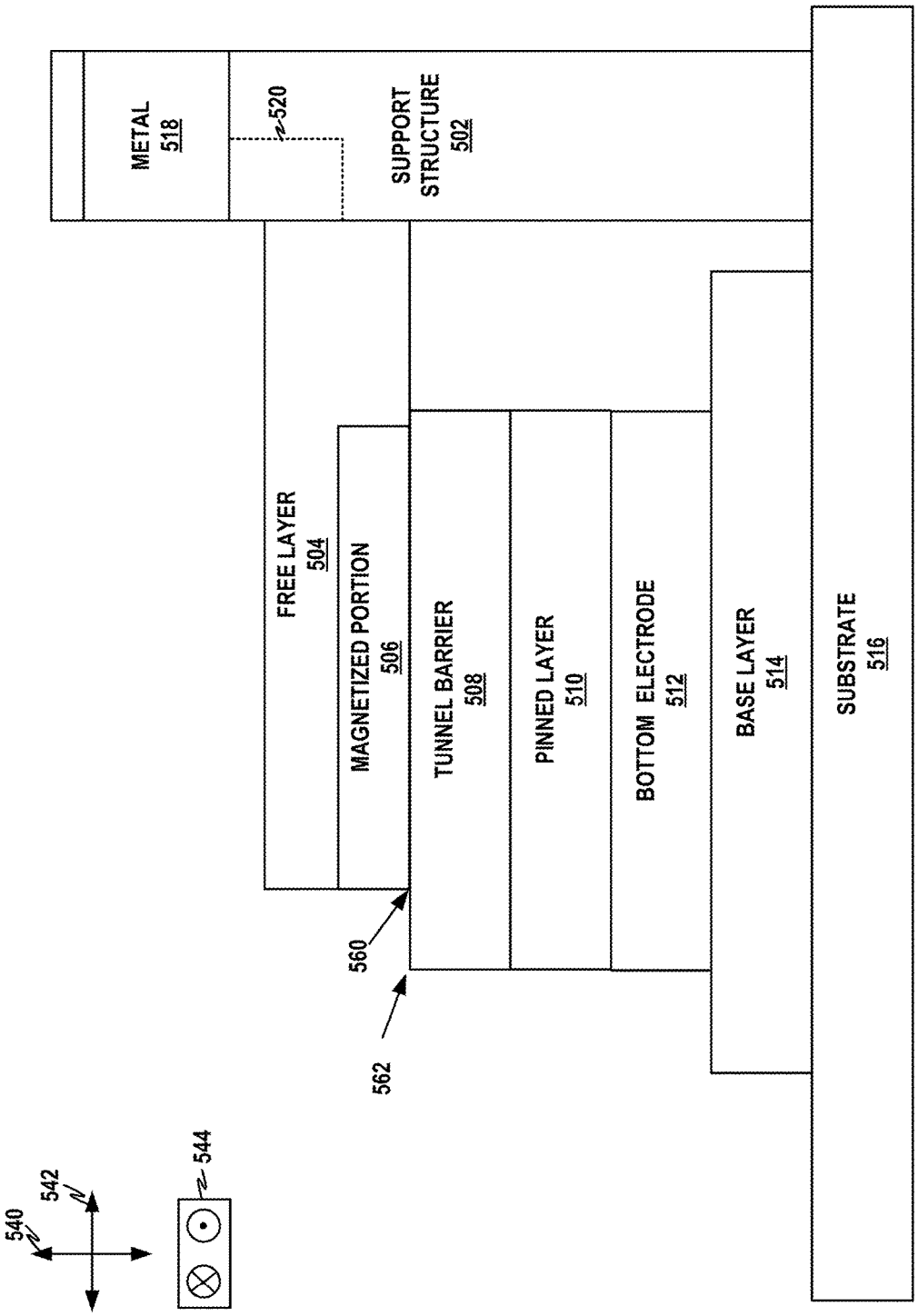
FIG. 5A shows a conceptual illustration of a cross-sectional view of a fifth MTJ element configured to detect acceleration.

FIG. 5A shows a conceptual illustration of a cross-sectional view of a fifth MTJ element 500 configured to detect acceleration. MTJ element 500 may include support structure 502, free layer 504, magnetized portion 506, tunnel barrier 508, pinned layer 510, bottom electrode 512, base layer 514, substrate 516, metal 518, and via 520, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. As shown, edge 560 of free layer 504 may be spaced apart from edge 562 of tunnel barrier 508 such that edge 562 extends further from support structure 502 along first horizontal direction 542 than edge 560. However, in other examples of FIGS. 5A and 5B, edge 560 of free layer 504 may be spaced apart from edge 562 of tunnel barrier 508 such that edge 560 extends further from support structure 502 along first horizontal direction 542 than edge 562 or edge 560 may extend a distance from support structure 502 along first horizontal direction 542 that corresponds to (e.g., matches) a distance that edge 562 extends from support structure 502 along first horizontal direction 542. Additionally, as shown, free layer 504 may be proximate (e.g., adjacent to, contacting, directly contacting, etc.) to tunnel barrier 508 during constant velocity (e.g., no acceleration).

Figure 5B:
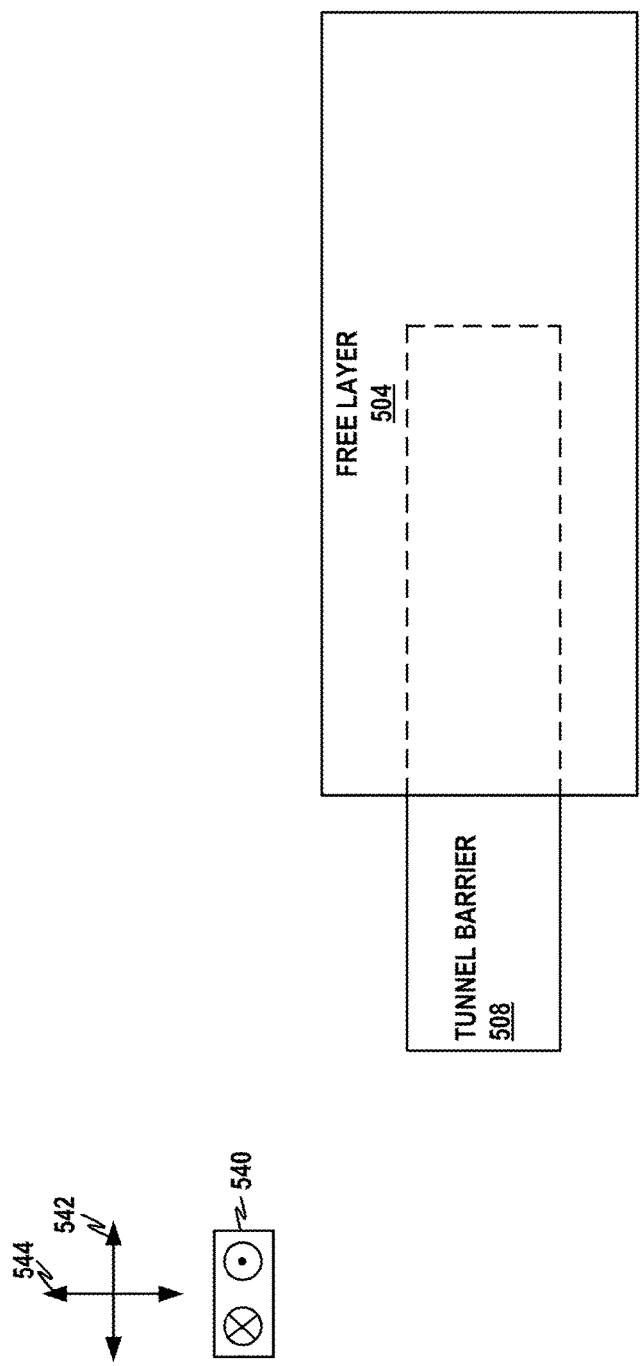
FIG. 5B shows a conceptual illustration of a top-view of the fifth MTJ element of FIG. 5A.

FIG. 5B shows a conceptual illustration of a top-view of the fifth MTJ element 500 of FIG. 5A. In the example of FIG. 5B, free layer 504 has a rectangular shape along first horizontal direction 542 and second horizontal direction 544.

Figure 6A:
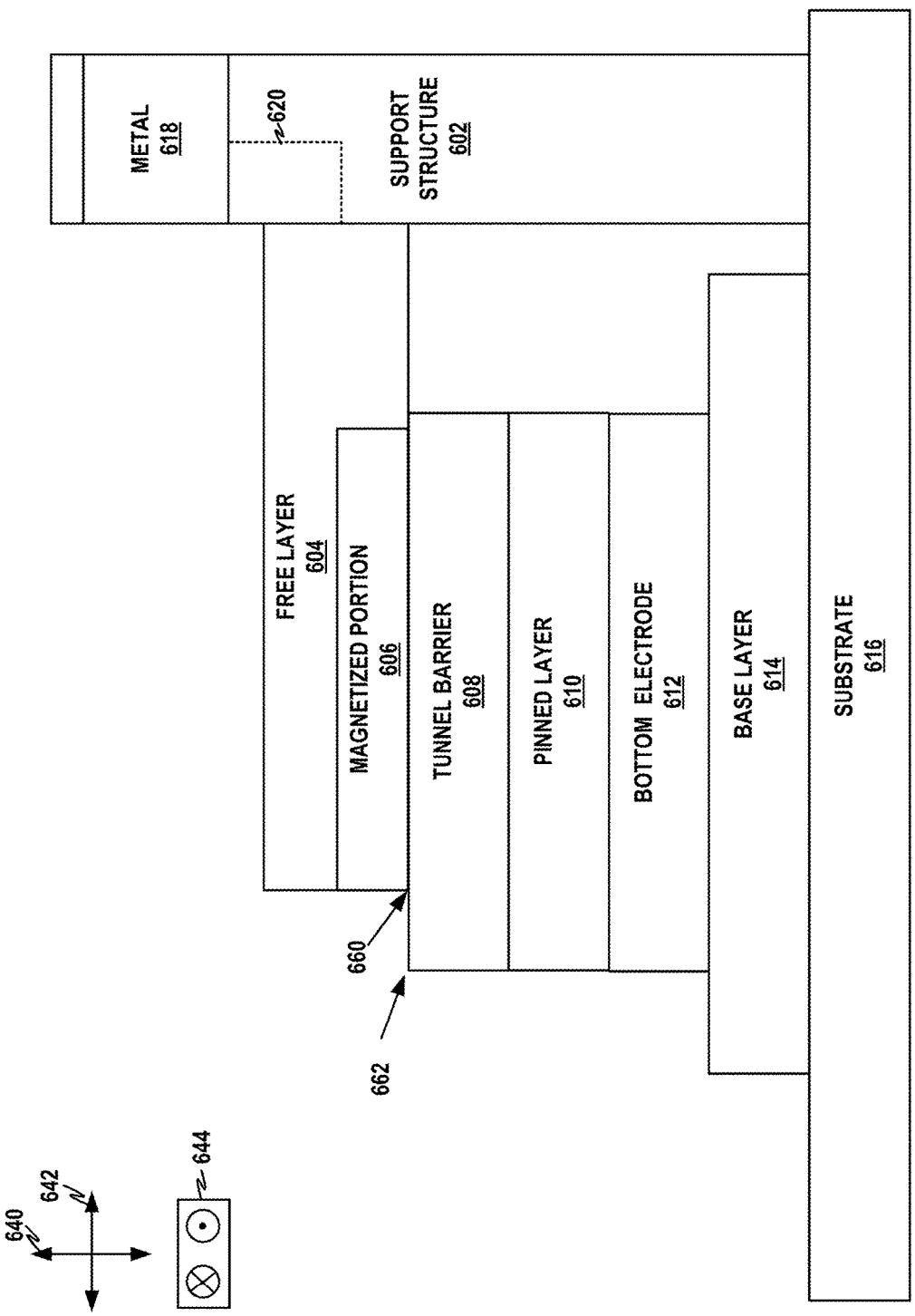
FIG. 6A shows a conceptual illustration of a cross-sectional view of a sixth MTJ element configured to detect acceleration.

FIG. 6A shows a conceptual illustration of a cross-sectional view of a sixth MTJ element 600 configured to detect acceleration. MTJ element 600 may include support structure 602, free layer 604, magnetized portion 606, tunnel barrier 608, pinned layer 610, bottom electrode 612, base layer 614, substrate 616, metal 618, and via 620, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. As shown, edge 660 of free layer 604 may be spaced apart from edge 662 of tunnel barrier 608 such that edge 662 extends further from support structure 602 along first horizontal direction 642 than edge 660. However, in other examples of FIGS. 6A and 6B, edge 660 of free layer 604 may be spaced apart from edge 662 of tunnel barrier 608 such that edge 660 extends further from support structure 602 along first horizontal direction 642 than edge 662 or edge 660 may extend a distance from support structure 602 along first horizontal direction 642 that corresponds to (e.g., matches) a distance that edge 662 extends from support structure 602 along first horizontal direction 642. Additionally, as shown, free layer 604 may be proximate (e.g., adjacent to, contacting, etc.) to tunnel barrier 608.

Figure 6B:
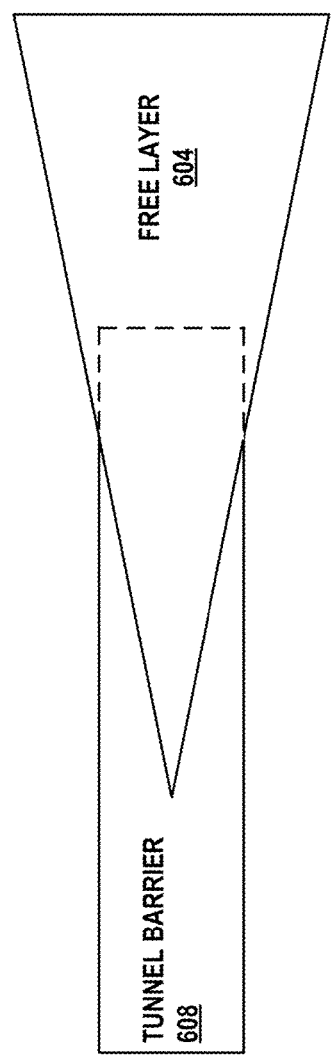
FIG. 6B shows a conceptual illustration of a top-view of the sixth MTJ element of FIG. 6A.
Figure 6B:
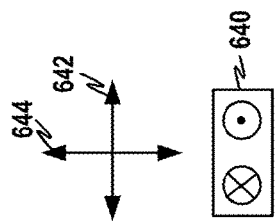

FIG. 6B shows a conceptual illustration of a top-view of the sixth MTJ element 600 of FIG. 6A. In the example of FIG. 6B, free layer 604 has a triangular shape along first horizontal direction 642 and second horizontal direction 644.

Figure 7A:
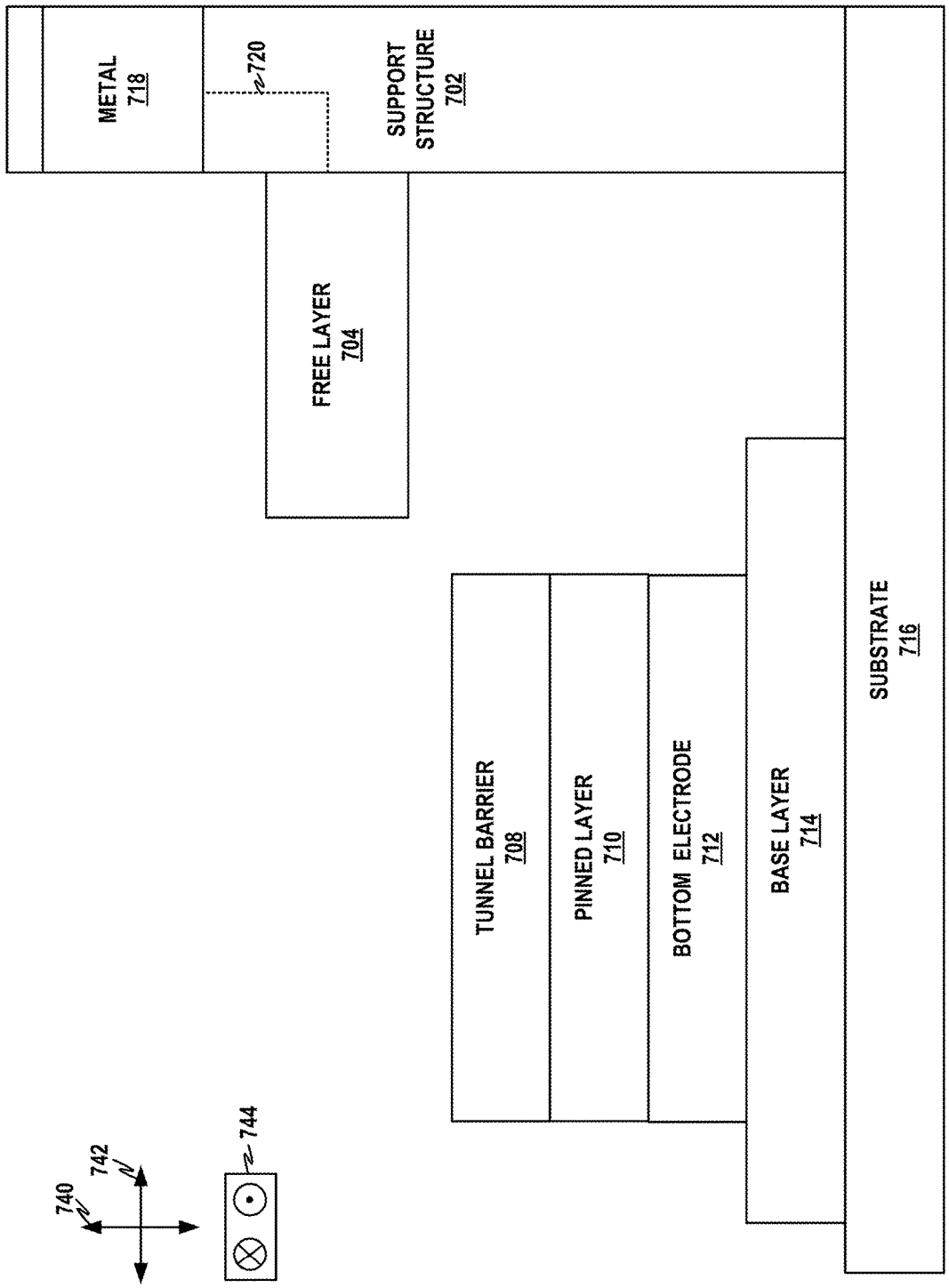
FIG. 7A shows a conceptual illustration of a cross-sectional view of a seventh MTJ element configured to detect acceleration.

FIG. 7A shows a conceptual illustration of a cross-sectional view of a seventh MTJ element 700 configured to detect acceleration. MTJ element 700 may include support structure 702, free layer 704, magnetized portion 706, tunnel barrier 708, pinned layer 710, bottom electrode 712, base layer 714, substrate 716, metal 718, and via 720, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. As shown, free layer 704 may be spaced apart from tunnel barrier 708 along first horizontal direction 742. In the example of FIG. 7A, free layer 704 is spaced apart from tunnel barrier 708 along vertical direction 704.

FIG. 7B shows a conceptual illustration of a top-view of the seventh MTJ element 700 of FIG. 7A. In the example of FIG. 7B, free layer 704 has a rectangular shape along first horizontal direction 742 and second horizontal direction 744.

FIG. 8A shows a conceptual illustration of a cross-sectional view of an eighth MTJ element 800 configured to detect acceleration. MTJ element 800 may include support structure 802, free layer 804, magnetized portion 806, tunnel barrier 808, pinned layer 810, bottom electrode 812, base layer 814, substrate 816, metal 818, and via 820, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. As shown, free layer 804 may be spaced apart from tunnel barrier 808 along first horizontal direction 842. In the example of FIG. 8A, free layer 804 is spaced apart from tunnel barrier 808 along vertical direction 840.

Figure 8B:
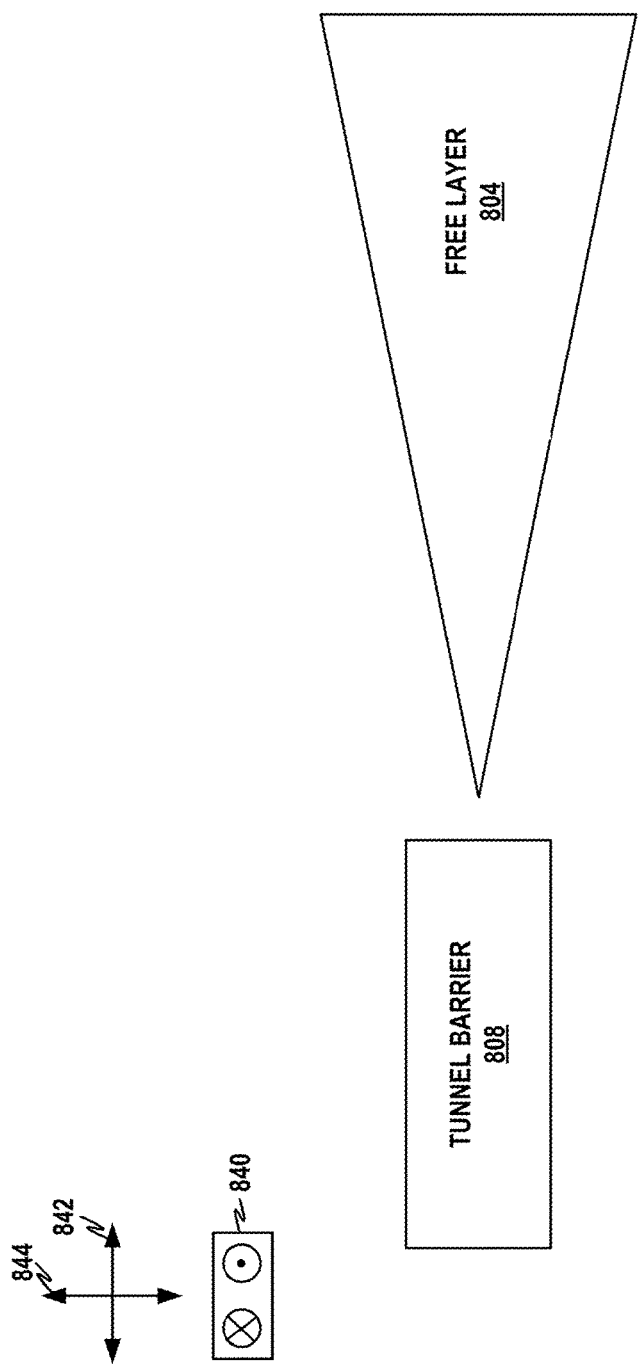
FIG. 8B shows a conceptual illustration of a top-view of the eighth MTJ element of FIG. 8A.

FIG. 8B shows a conceptual illustration of a top-view of the eighth MTJ element of FIG. 8A. In the example of FIG. 8B, free layer 804 has a triangular shape along first horizontal direction 842 and second horizontal direction 844.

Figure 9A:
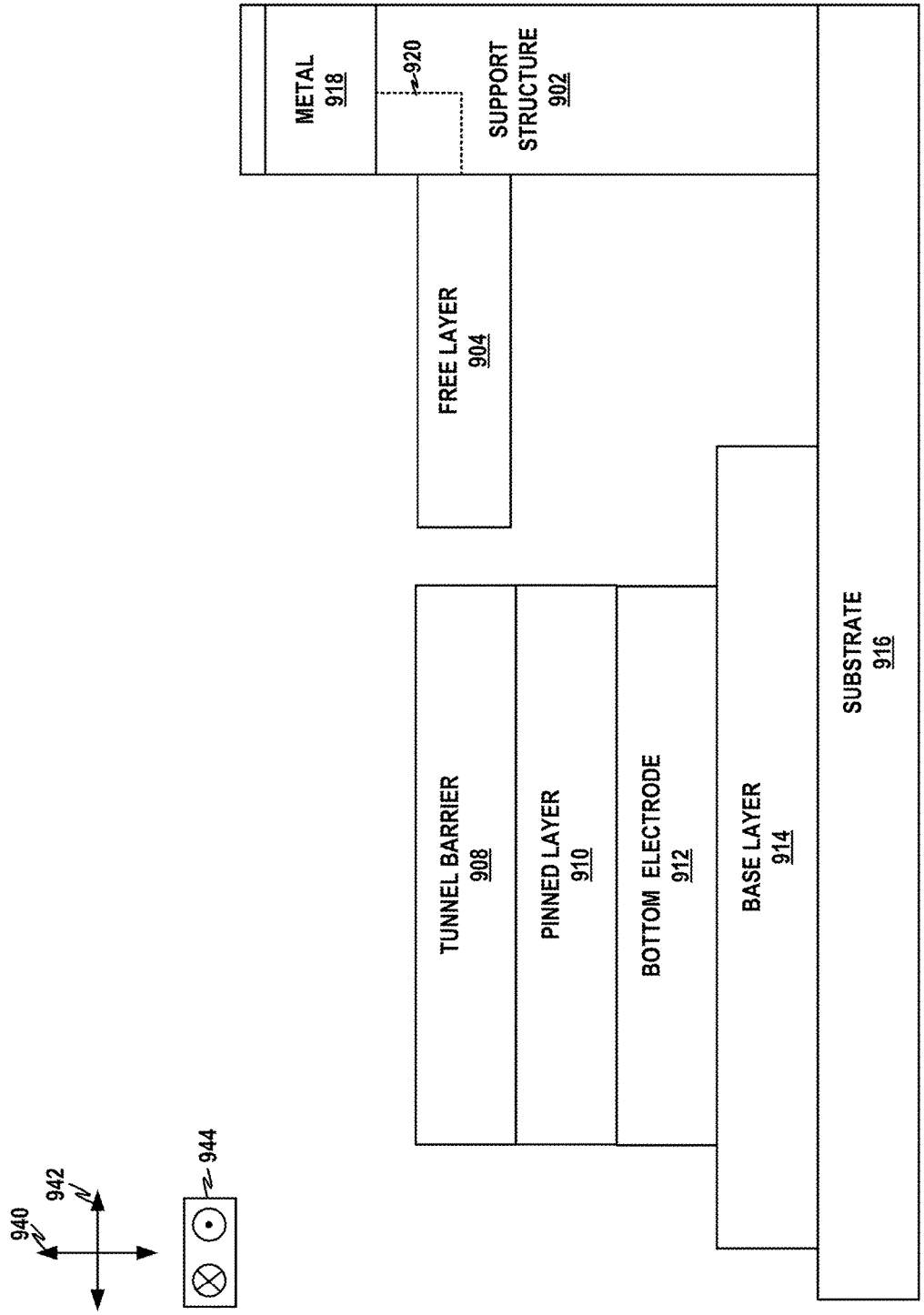
FIG. 9A shows a conceptual illustration of a cross-sectional view of a ninth MTJ element configured to detect acceleration.

FIG. 9A shows a conceptual illustration of a cross-sectional view of a ninth MTJ element 900 configured to detect acceleration. MTJ element 900 may include support structure 902, free layer 904, magnetized portion 906, tunnel barrier 908, pinned layer 910, bottom electrode 912, base layer 914, substrate 916, metal 918, and via 920, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. As shown, free layer 904 may be spaced apart from tunnel barrier 908 along first horizontal direction 942. In the example of FIG. 9A, free layer 904 and tunnel barrier 908 are arranged side-by-side. For example, a lower surface of free layer 904 is spaced apart from substrate 916 a distance corresponding (e.g., equal) to a distance between a lower surface of tunnel barrier 908 and substrate 916.

Figure 9B:
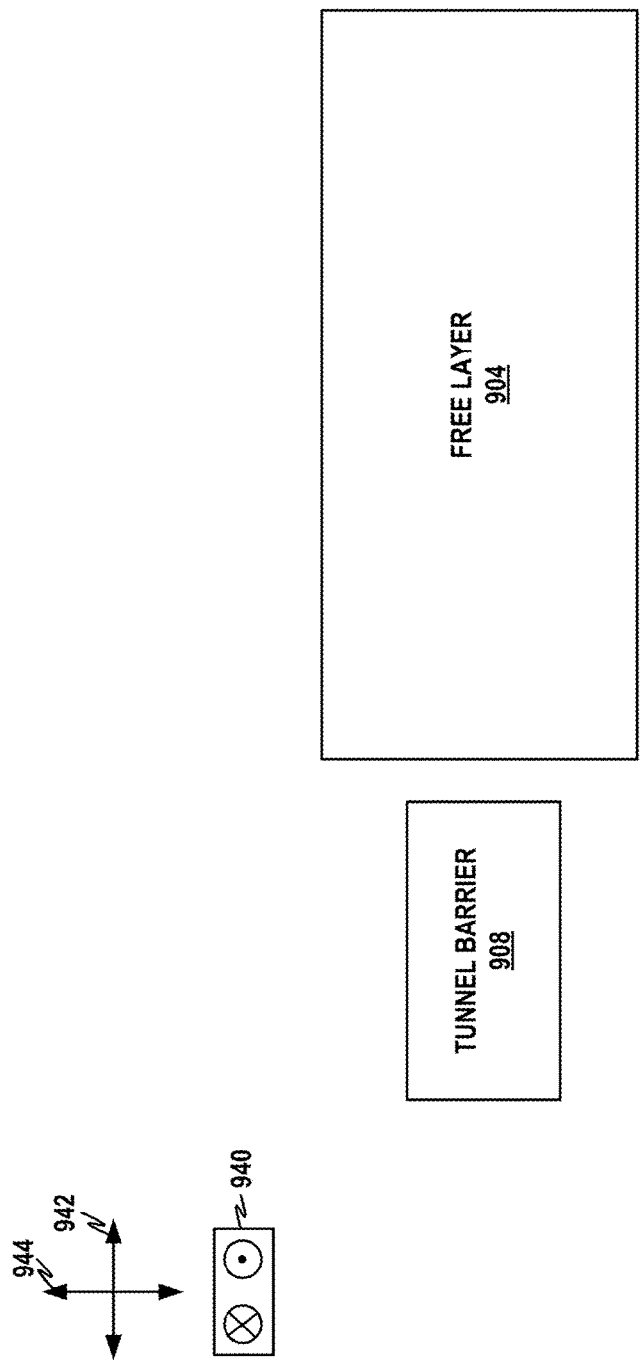
FIG. 9B shows a conceptual illustration of a top-view of the ninth MTJ element of FIG. 9A.

FIG. 9B shows a conceptual illustration of a top-view of the ninth MTJ element 900 of FIG. 9A. In the example of FIG. 9B, free layer 904 has a rectangular shape along first horizontal direction 942 and second horizontal direction 944.

Figure 10A:
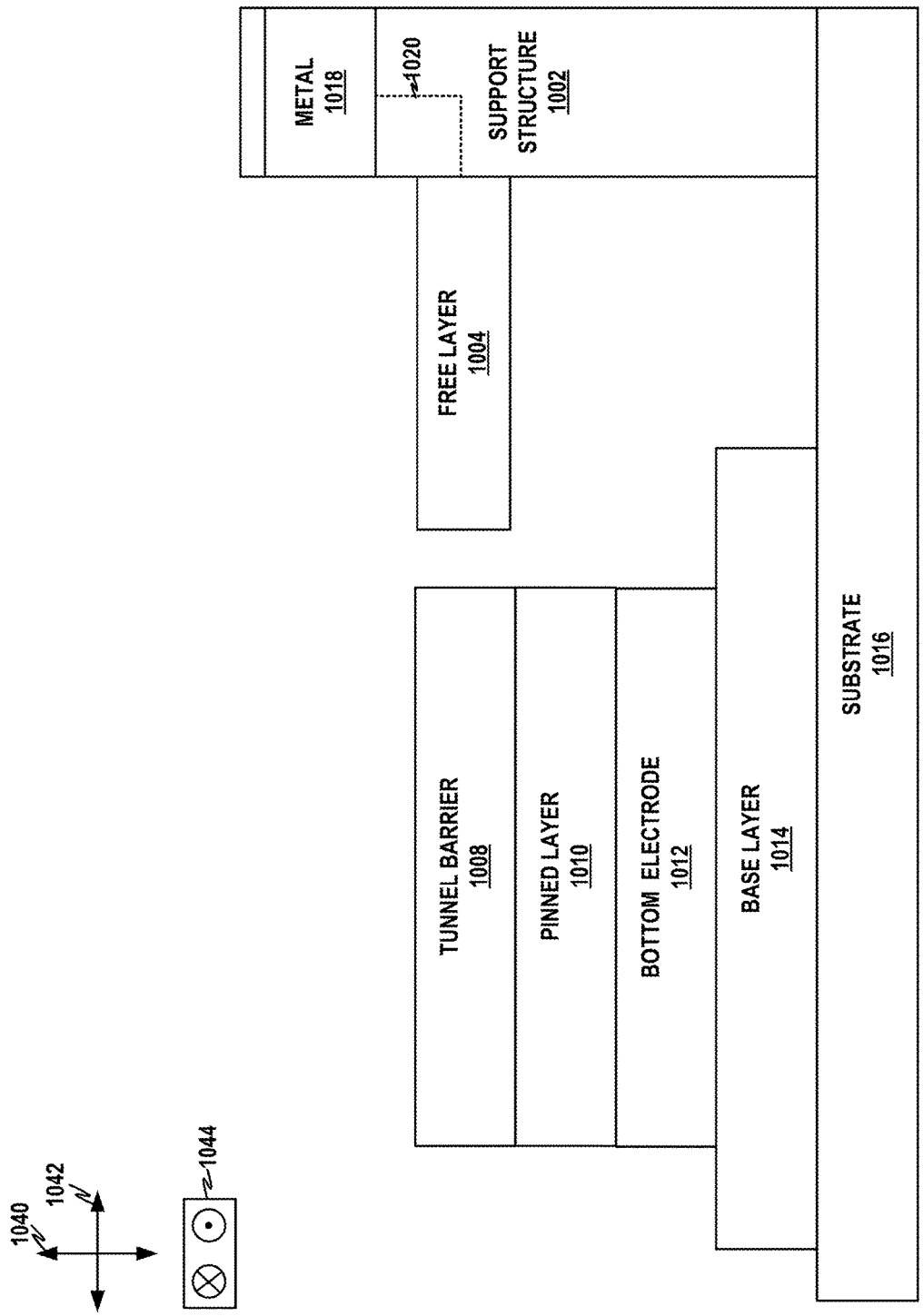
FIG. 10A shows a conceptual illustration of a cross-sectional view of a tenth MTJ element configured to detect acceleration.

FIG. 10A shows a conceptual illustration of a cross-sectional view of a tenth MTJ element 1000 configured to detect acceleration. MTJ element 1000 may include support structure 1002, free layer 1004, magnetized portion 1006, tunnel barrier 1008, pinned layer 1010, bottom electrode 1012, base layer 1014, substrate 1016, metal 1018, and via 1020, which may be examples of support structure 102, free layer 104, magnetized portion 106, tunnel barrier 108, pinned layer 110, bottom electrode 112, base layer 114, substrate 116, metal 118, and via 120 of FIG. 1A, respectively. As shown, free layer 1004 may be spaced apart from tunnel barrier 1008 along first horizontal direction 1042. In the example of FIG. 10A, free layer 1004 and tunnel barrier 1008 are arranged side-by-side. For example, a lower surface of free layer 1004 is spaced apart from substrate 1016 a distance corresponding (e.g., equal) to a distance between a lower surface of tunnel barrier 1008 and substrate 1016.

Figure 10B:
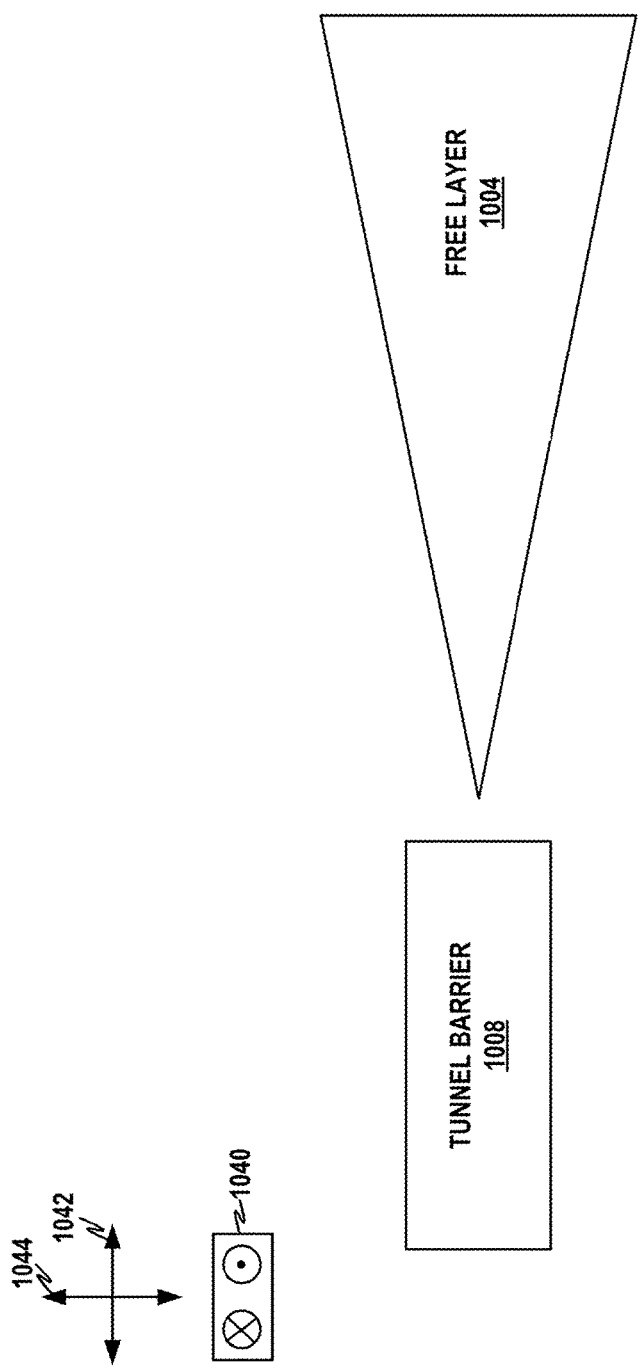
FIG. 10B shows a conceptual illustration of a top-view of the tenth MTJ element of FIG. 10A.

FIG. 10B shows a conceptual illustration of a top-view of the tenth MTJ element 1000 of FIG. 10A. In the example of FIG. 10B, free layer 1004 has a triangular shape along first horizontal direction 1042 and second horizontal direction 1044.

Figure 11:
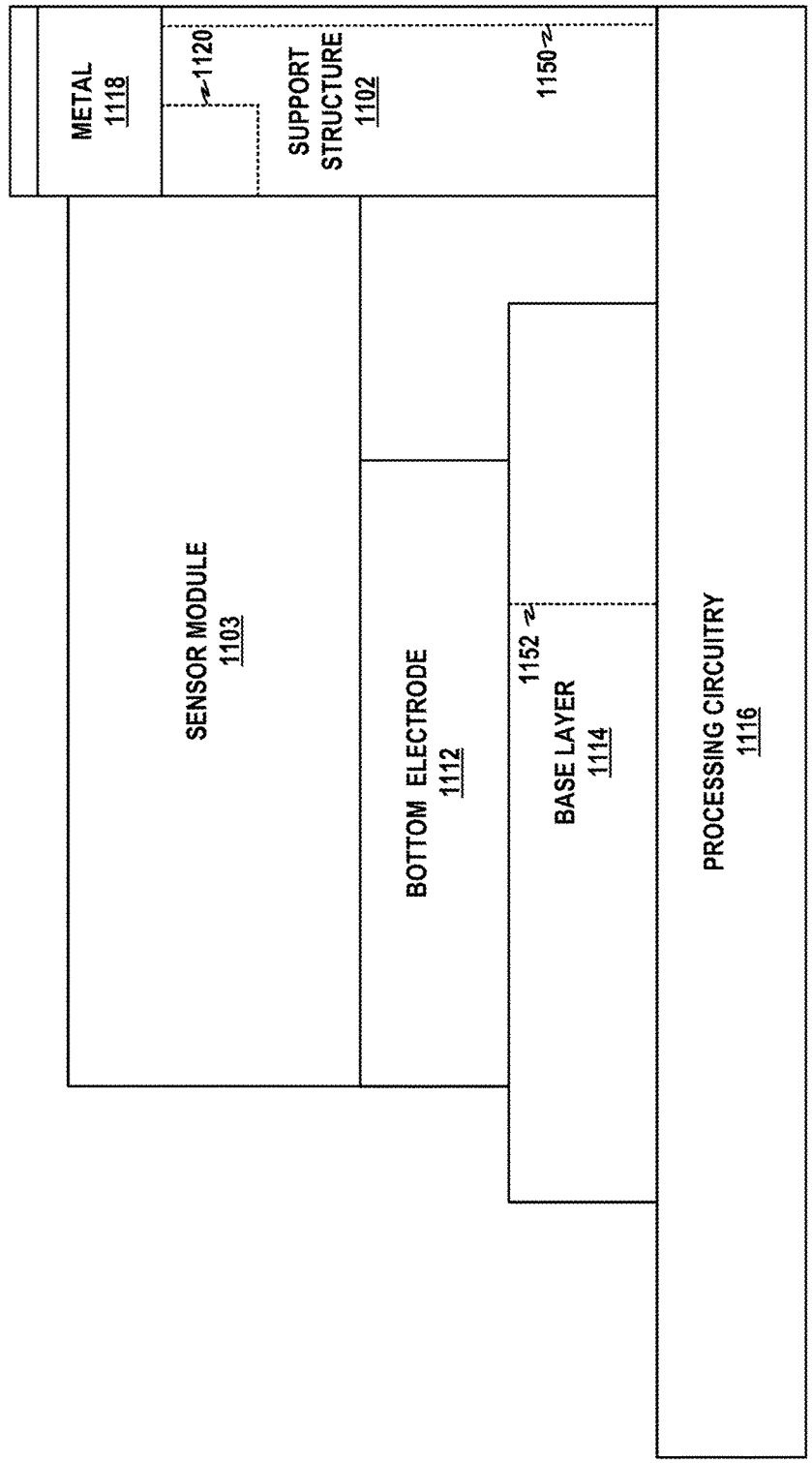
FIG. 11 shows a conceptual illustration of an accelerometer sensor that may be used to implement the techniques of the present disclosure.

FIG. 11 shows a conceptual illustration of an accelerometer sensor 1100 that may be used to implement the techniques of the present disclosure. Accelerometer sensor 1100 may include support structure 1102, bottom electrode 1112, base layer 1114, processing circuitry 1116, metal 1118, and via 1120, which may be examples of support structure 102, bottom electrode 112, base layer 114, substrate 116, metal 118, and via 120 of FIG. 1A, respectively. MTJ element 1100 may further include sensor module 1103, which may comprise a free layer, a tunnel barrier, and a pinned layer arranged for detecting acceleration (e.g., see FIGS. 1A-1D, 2A-2B, 3A-3B, 4A-4B, 5A-5B, 6A-6B, 7A-7B, 8A-8B, 9A-9B, and 10A-10B).

Sensor devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions.

Via 1150 and via 1152 may be formed of an electrically conductive material, such as, for example, but not limited to, tungsten, aluminum, aluminum-copper, and/or copper. In the example of FIG. 11, via 1150 electrically connects metal 1118 to processing circuitry 1116. In this example, via 1152 electrically connects bottom electrode 1112 to processing circuitry 1116.

Processing circuitry 1116 is configured to monitor the resistance and/or magnetoresistance of sensor module 1103, which may correspond to an acceleration of accelerometer sensor 1100. This monitoring of the resistance and/or magnetoresistance is termed Rmonitor, which represents the real time measuring of the MTJ element resistance and/or magnetoresistance. For example, processing circuitry 1116 may determine that an acceleration is increasing in response to a magnitude of resistance and/or magnetoresistance of sensor module 1103 increasing from a threshold resistance corresponding to no acceleration. In some examples, processing circuitry 1116 may determine that no acceleration has occurred (e.g., constant velocity) in response to a magnitude of resistance and/or magnetoresistance of sensor module 1103 corresponding (e.g., equal) to a threshold resistance corresponding to no acceleration.

Processing circuitry 1116 may include one or more processors, including one or more microprocessors, digital signal processors (DSPs), ASICs, field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

Figure 12:
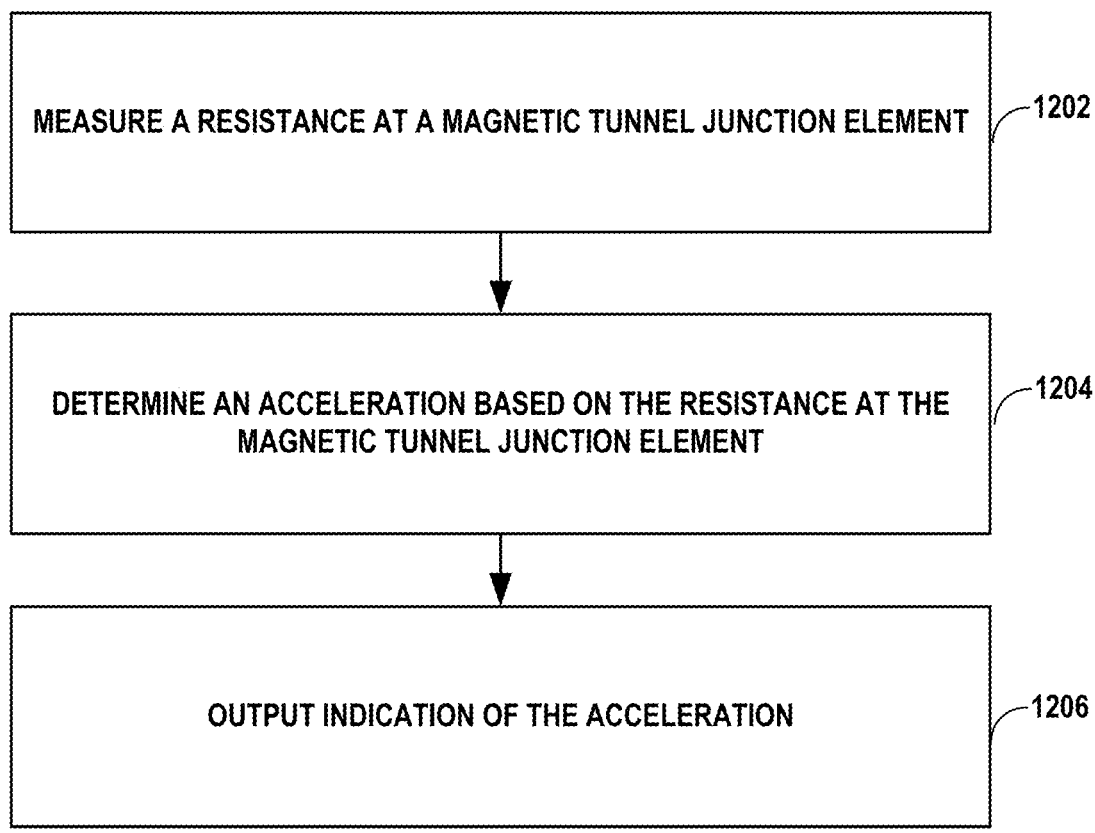
FIG. 12 shows a flowchart of a process for detecting acceleration in accordance with the techniques of this disclosure.

FIG. 12 shows a flowchart of a process for detecting acceleration in accordance with the techniques of this disclosure. The techniques of FIG. 12 may, for example, be performed by a MTJ element described above with respect to any combination of FIGS. 1A-1D, 2A-2B, 3A-3B, 4A-4B, 5A-5B, 6A-6B, 7A-7B, 8A-8B, 9A-9B, 10A-10B, and 11. Processing circuitry 1116 measures a resistance at a MTJ element (1202). Processing circuitry 1116 determines an acceleration based on the resistance at the MTJ element (1204). For instance, processing circuitry 1116 determines an acceleration based on the resistance at sensor module 1103. Processing circuitry 1116 outputs an indication of the acceleration (1206).

The term "circuitry" as used herein may refer to any of the foregoing structure or any other structure suitable for processing program code and/or data or otherwise implementing the techniques described herein. Circuitry may, for example, any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. A magnetic tunnel junction (MTJ) based sensor device, the device comprising:
   a MTJ element comprising a free layer, a pinned layer, and a tunnel barrier, the tunnel barrier being arranged between the free layer and the pinned layer, wherein the free layer is adapted to flex away from the tunnel barrier during acceleration; and
   processing circuitry configured to:
      measure a resistance at the MTJ element; and
      determine acceleration based on the resistance at the MTJ element.

2. The device of claim 1, wherein the free layer comprises a first edge and a second edge on an opposite side of the free layer from the first edge, the device further comprising:
   a support structure rigidly attached to the second edge of the free layer, the support structure being spaced apart from the pinned layer along a horizontal direction and extending at least between the free layer and the pinned layer along a vertical direction, wherein the vertical direction is perpendicular to the horizontal direction.

3. The device of claim 2, wherein the first edge is adapted to freely move along the vertical direction while the free layer flexes away from the tunnel barrier during acceleration.

4. The device of claim 2, wherein the first edge of the free layer is spaced apart from an edge of the tunnel barrier such that the edge of the tunnel barrier extends further from the support structure along the horizontal direction than the first edge of the free layer.

5. The device of claim 2, wherein the first edge of the free layer extends a distance from the support structure along the horizontal direction that corresponds to a distance that an edge of the tunnel barrier extends from the support structure along the horizontal direction.

6. The device of claim 2, wherein the first edge of the free layer is spaced apart from an edge of the tunnel barrier such that the first edge of the free layer extends further from the support structure along the horizontal direction than the edge of the tunnel barrier.

7. The device of claim 1, wherein the free layer is adapted to flex away from the tunnel barrier along a vertical direction during acceleration, wherein the free layer has a rectangular shape along a first horizontal direction and second horizontal direction, wherein the first horizontal direction is perpendicular to the second horizontal direction and to the vertical direction.

8. The device of claim 1, wherein the free layer is adapted to flex away from the tunnel barrier along a vertical direction during acceleration, wherein the free layer has a triangular shape along a first horizontal direction and second horizontal direction, wherein the first horizontal direction is perpendicular to the second horizontal direction and to the vertical direction.

9. The device of claim 1, wherein the free layer is spaced apart from the tunnel barrier during constant velocity.

10. The device of claim 1, wherein the free layer directly contacts the tunnel barrier during constant velocity.

11. The device of claim 1, wherein the free layer extends over the tunnel barrier.

12. The device of claim 1, wherein the free layer is spaced apart from the tunnel barrier along a horizontal direction and along a vertical direction and wherein the vertical direction is perpendicular to the horizontal direction.

13. The device of claim 1, wherein the free layer is spaced apart from the tunnel barrier along a horizontal direction, wherein the free layer is spaced above a substrate along a vertical direction a distance corresponding to a distance between the tunnel barrier and the substrate.

14. The device of claim 1, wherein, to determine acceleration based on the resistance at the MTJ element, the processing circuitry is configured to:
determine acceleration is increasing in response to a magnitude of the resistance increasing from a threshold resistance corresponding to no acceleration.

15. A method for detecting acceleration using a magnetic tunnel junction (MTJ) based sensor device, the method comprising:
measuring, by processing circuitry, a resistance at a MTJ element, wherein the MTJ element comprises a free layer, a pinned layer, and a tunnel barrier, the tunnel barrier being arranged between the free layer and the pinned layer, and wherein the free layer is adapted to flex away from the tunnel barrier during acceleration; and
determining, by the processing circuitry, acceleration based on the resistance at the MTJ element.

16. The method of claim 15, wherein the free layer comprises a first edge and a second edge on an opposite side of the free layer from the first edge, the MTJ element further comprising:
a support structure rigidly attached to the second edge of the free layer, the support structure being spaced apart from the pinned layer along a horizontal direction and extending at least between the free layer and the pinned layer along a vertical direction, wherein the vertical direction is perpendicular to the horizontal direction.

17. The method of claim 16, wherein the first edge is adapted to freely move along the vertical direction while the free layer flexes away from the tunnel barrier during acceleration.

18. The method of claim 16, wherein the first edge of the free layer is spaced apart from an edge of the tunnel barrier such that the edge of the tunnel barrier extends further from the support structure along the horizontal direction than the first edge of the free layer.

19. The method of claim 15, wherein determining acceleration based on the resistance at the MTJ element comprises:
determining acceleration is increasing in response to a magnitude of the resistance increasing from a threshold resistance corresponding to no acceleration.

20. A magnetic tunnel junction (MTJ) based sensor device, the device comprising:
means for measuring a resistance at a MTJ element, wherein the MTJ element comprises a free layer, a pinned layer, and a tunnel barrier, the tunnel barrier being arranged between the free layer and the pinned layer, and wherein the free layer is adapted to flex away from the tunnel barrier during acceleration; and
means for determining acceleration based on the resistance at the MTJ element.

* * * * *